(12) United States Patent
Choi et al.

(10) Patent No.: US 10,615,369 B2
(45) Date of Patent: Apr. 7, 2020

(54) DISPLAY PANEL COMPRISING MODULE HOLE AND BLOCKING GROOVE IN DISPLAY AREA AND ELECTRONIC DEVICE HAVING THE SAME

(71) Applicant: Samsung Display Co., Ltd., Yongin-si, Gyeonggi-do (KR)

(72) Inventors: Wonwoo Choi, Hwaseong-si (KR); Wooyong Sung, Seoul (KR); Seungho Yoon, Hwaseong-si (KR); Wonje Cho, Osan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/922,745

(22) Filed: Mar. 15, 2018

(65) Prior Publication Data

US 2019/0051859 A1 Feb. 14, 2019

(30) Foreign Application Priority Data

Aug. 11, 2017 (KR) ........................ 10-2017-0102611

(51) Int. Cl.
*H01L 51/52* (2006.01)
*H01L 27/32* (2006.01)
*H01L 51/00* (2006.01)

(52) U.S. Cl.
CPC ...... *H01L 51/5253* (2013.01); *H01L 27/3248* (2013.01); *H01L 27/3262* (2013.01);
(Continued)

(58) Field of Classification Search
CPC ............... H01L 27/124; H01L 51/5253; H01L 51/5237
See application file for complete search history.

(56) References Cited

U.S. PATENT DOCUMENTS 8,913,220 B2  12/2014  Kim et al.
9,632,487 B2  4/2017  Kim et al.
(Continued)

FOREIGN PATENT DOCUMENTS

KR  10-1171192 B1  8/2012
KR  10-1298612 B1  8/2013
(Continued)

OTHER PUBLICATIONS

EPO Search Report dated Dec. 4, 2018, for corresponding European Patent Application No. 18176255 (2 pages).

*Primary Examiner* — Daniel Whalen
(74) *Attorney, Agent, or Firm* — Lewis Roca Rothgerber Christie LLP

(57) ABSTRACT

A display panel includes: a base substrate including a front surface and a rear surface, and a display area and a periphery area adjacent to the display area when viewed in a plane; a pixel layer including a plurality of pixels in the display area; and a cover layer on the base substrate and including an inorganic material, and the base substrate includes: a module hole defined in the display area and passing through the front surface and the rear surface of the base substrate; and a blocking groove adjacent to the module hole and recessed from the front surface of the base substrate, and the cover layer includes a passing-through portion covering the front surface of the base substrate and overlapping the blocking groove.

27 Claims, 23 Drawing Sheets

(52) U.S. Cl.
CPC ...... *H01L 51/0097* (2013.01); *H01L 27/3244* (2013.01); *H01L 51/5256* (2013.01)

(56) References Cited

U.S. PATENT DOCUMENTS

| | | |
|---|---|---|
| 10,268,325 B2 | 4/2019 | Suh |
| 10,403,645 B2 | 9/2019 | Namkung et al. |
| 2007/0090457 A1 | 4/2007 | Lee et al. |
| 2014/0027791 A1 | 1/2014 | Cho et al. |
| 2016/0202515 A1 | 7/2016 | Watanabe et al. |
| 2016/0307973 A1 | 10/2016 | Yang et al. |
| 2016/0351645 A1 | 12/2016 | You et al. |
| 2016/0363909 A1 | 12/2016 | Kang et al. |
| 2017/0148856 A1* | 5/2017 | Choi ................... H01L 51/5253 |
| 2017/0150618 A1 | 5/2017 | Choi et al. |
| 2017/0288004 A1 | 10/2017 | Kim et al. |

FOREIGN PATENT DOCUMENTS

| | | |
|---|---|---|
| KR | 10-2014-0014525 A | 2/2014 |
| KR | 10-2015-0010037 A | 1/2015 |
| KR | 10-2015-0025388 A | 3/2015 |
| KR | 10-2016-0028610 A | 3/2016 |
| KR | 10-2016-0124310 A | 10/2016 |
| KR | 10-2016-0145915 A | 12/2016 |
| KR | 10-2017-0001935 A | 1/2017 |
| KR | 10-2017-0015632 A | 2/2017 |
| KR | 10-2017-0059527 A | 5/2017 |
| KR | 10-2017-0059864 A | 5/2017 |
| KR | 10-2017-0115177 A | 10/2017 |
| KR | 10-2018-0002126 A | 1/2018 |

\* cited by examiner

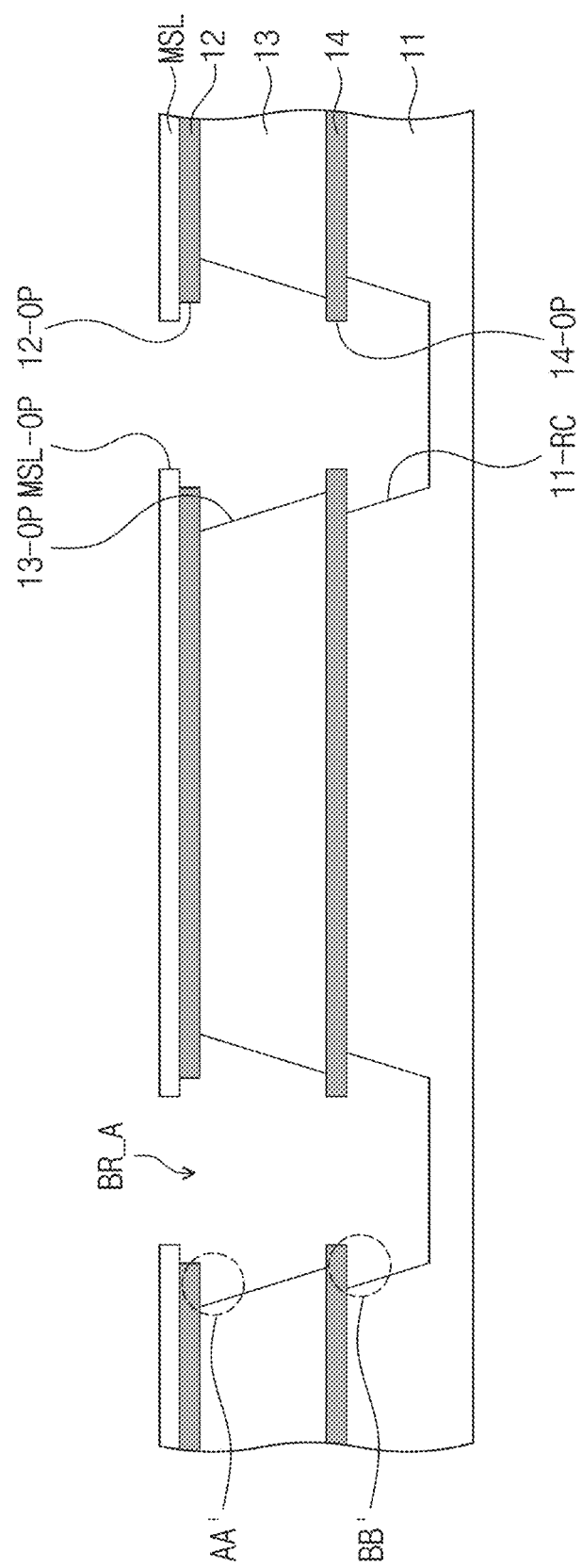

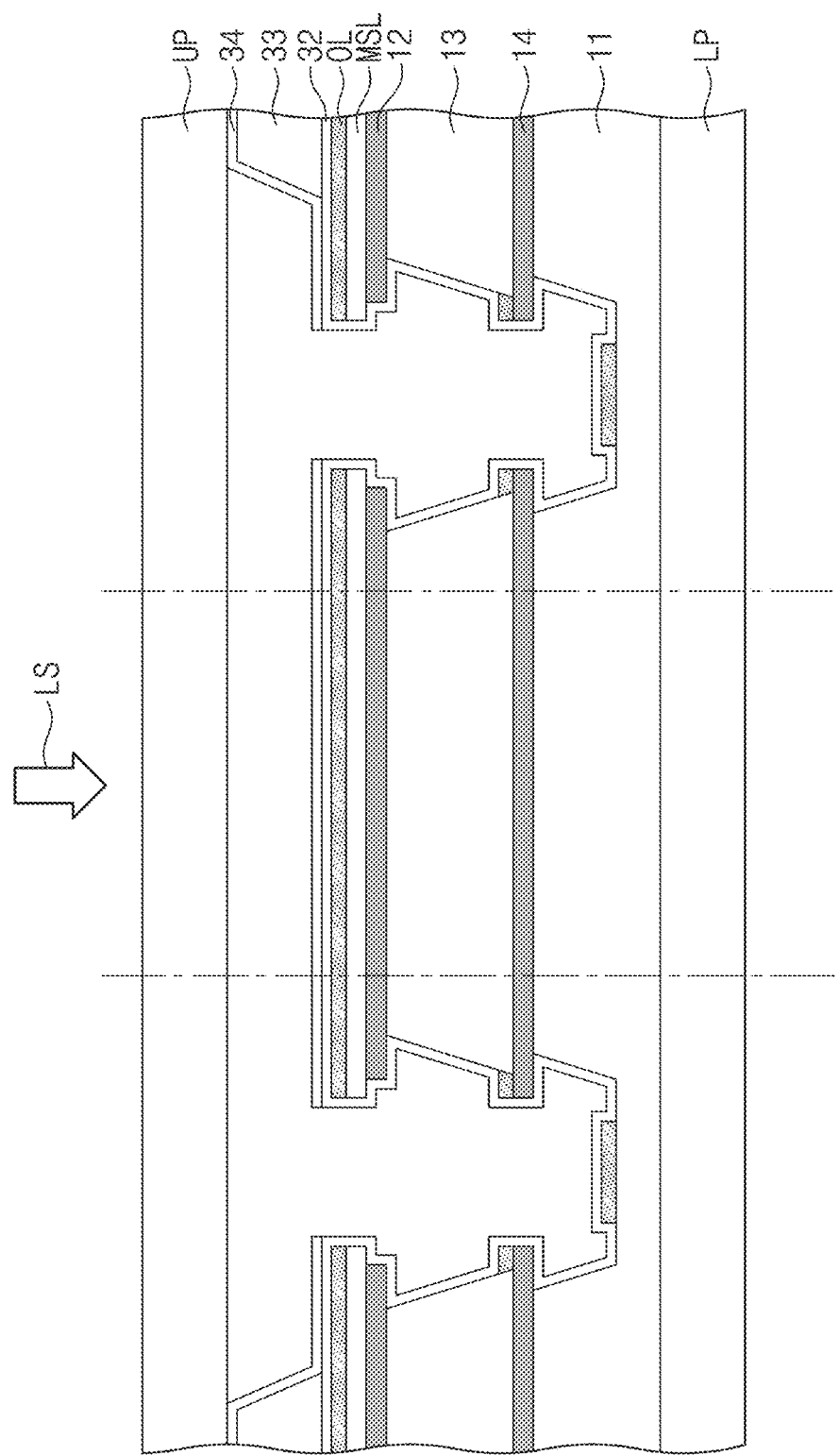

FIG. 12J
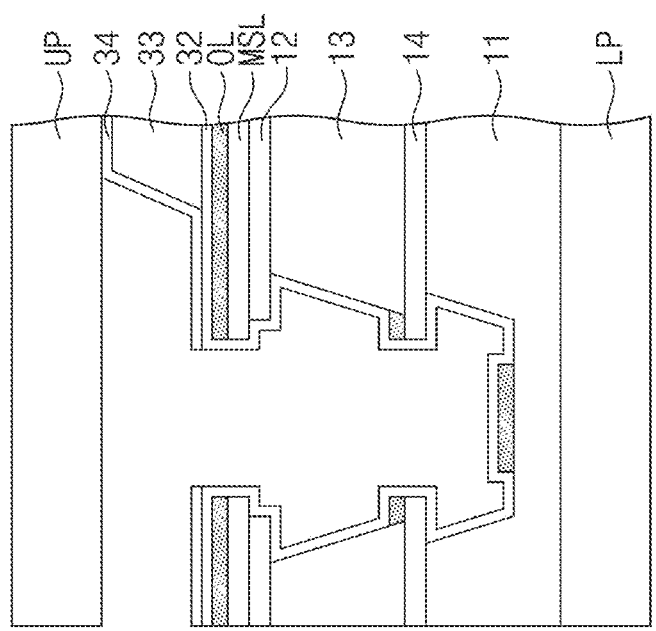
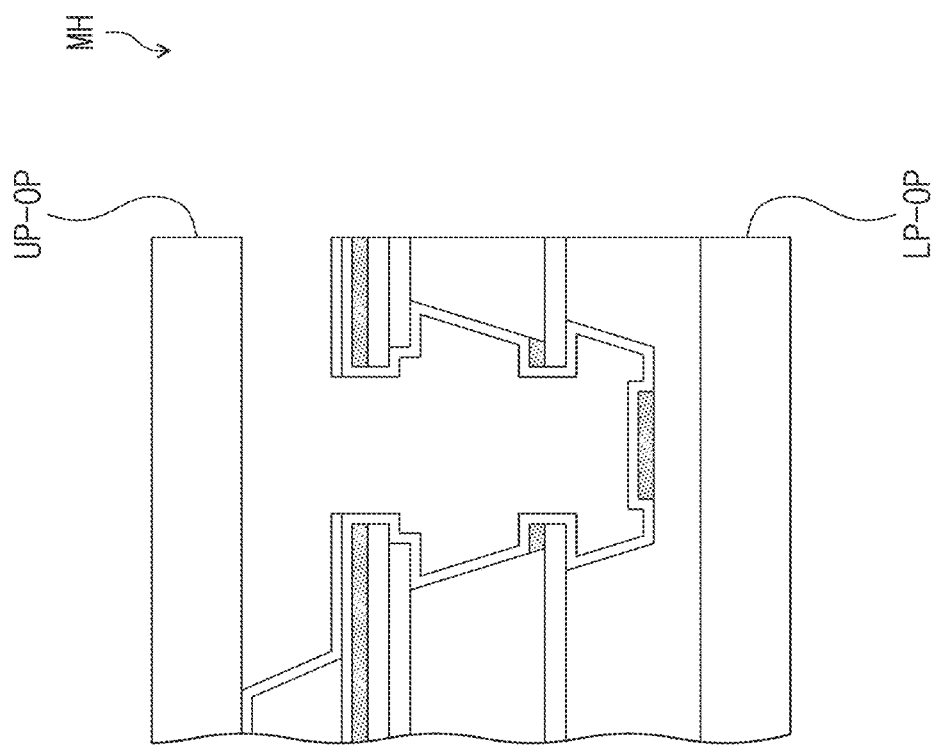

DISPLAY PANEL COMPRISING MODULE HOLE AND BLOCKING GROOVE IN DISPLAY AREA AND ELECTRONIC DEVICE HAVING THE SAME

CROSS-REFERENCE TO RELATED APPLICATION

This patent application claims priority to and the benefit of Korean Patent Application No. 10-2017-0102611, filed on Aug. 11, 2017 in the Korean Intellectual Property Office, the entire content of which is hereby incorporated by reference.

BACKGROUND

1. Field

Aspects of embodiments of the present disclosure relate to a display panel and an electronic device having the same.

2. Description of the Related Art

An electronic device is activated by an electric signal. The electronic device may include a display device configured to display an image, or a touch sensor configured to sense an external input. In a display device, an organic light emitting display device has lower power consumption, high brightness, and high response speed.

The organic light emitting display device includes an organic light emitting device. The organic light emitting device is vulnerable to moisture or oxygen, thereby being easily damaged. Accordingly, in the organic light emitting display device, if the moisture or oxygen introduced from the outside is more stably blocked, it may result in the reliability of the organic light emitting display device being improved and the life span being improved.

SUMMARY

According to an aspect of embodiments of the present disclosure, a display panel has improved reliability, and an electronic device having the same is provided. According to another aspect of embodiments of the present disclosure, a display panel is provided in which inflow of a foreign pollutant may be prevented or substantially prevented, and an electronic device having the same is provided.

According to one or more embodiments of the inventive concept, a display panel includes: a base substrate including a front surface and a rear surface, and a display area and a periphery area adjacent to the display area when viewed in a plane; a pixel layer including a plurality of pixels in the display area; and a cover layer on the base substrate and containing an inorganic material, wherein the base substrate includes a module hole defined in the display area and passing through the front surface and the rear surface of the base substrate, and a blocking groove defined in the display area, adjacent to the module hole, and recessed from the front surface of the base substrate, and wherein the cover layer covers the front surface of the base substrate and includes a passing-through portion overlapping the blocking groove.

In an embodiment, the base substrate may include: a first base layer containing an organic material and including the rear surface of the base substrate; and a first barrier layer containing an inorganic material and arranged on the first base layer to include the front surface of the base substrate, and the blocking groove may include: a passing-through portion passing through the first barrier layer; and a recessed portion defined in the first base layer by overlapping the passing-through portion passing through the first barrier layer, and a width of the passing-through portion of the cover layer may be equal to or less than a width of the passing-through portion passing through the first barrier layer.

In an embodiment, a width of the recessed portion may be greater than the width of the passing-through portion passing through the first barrier layer.

In an embodiment, the base substrate may further include: a second base layer between the first base layer and the first barrier layer and containing an organic material; and a second barrier layer between the first base layer and the first barrier layer and containing an inorganic material, and the first barrier layer and the second barrier layer may be alternately arranged with the first base layer and the second base layer.

In an embodiment, the blocking groove may further include a passing-through portion passing through the second barrier layer; and a passing-through portion passing through the second base layer, and a width of the second barrier layer may be less than a width of the passing-through portion passing through the second base layer.

In an embodiment, the blocking groove may further include: a passing-through portion passing through the second barrier layer; and a passing-through portion passing through the second base layer, and a width of the passing-through portion passing through the second barrier layer may be less than a width of the passing-through portion passing through the second base layer.

In an embodiment, the pixel layer may include: a thin film device layer on the base substrate and including a thin film transistor; and a display device layer on the base substrate and including an organic light emitting device connected to the thin film transistor, and the cover layer may include a portion of the display device layer and the thin film device layer.

In an embodiment, the cover layer may include an inorganic film or a metal film.

In an embodiment, the organic light emitting device may include: a first electrode; an organic layer on the first electrode and including an organic light emitting layer; and a second electrode on the organic layer, and the thin film device layer may include a plurality of conductive layers and a plurality of insulation layers, and the cover layer may extend from at least one of the conductive layers, the insulation layers, and the first electrode.

In an embodiment, the display device layer may further include a sealing member on the organic light emitting layer, and the sealing member may cover the blocking groove and the passing-through portion of the cover layer.

In an embodiment, the sealing member may include: a first inorganic film; a second inorganic film on the first inorganic film; and an organic film between the first inorganic film and the second inorganic film, and the first inorganic film and the second inorganic film on the organic light emitting device may be spaced from each other with the organic film therebetween, and may be in contact with each other within the blocking groove.

According to one or more embodiments of the inventive concept, an electronic device includes: a display panel comprising a plurality of pixels, and a base substrate comprising a front surface including a display area in which the pixels are arranged and a periphery area adjacent to the display area, and a rear surface opposite to the front surface; and an electronic module electrically connected to the display panel, and the base substrate includes: a module hole defined in the display area and passing through the front surface and the rear surface of the base substrate; and a blocking groove defined in the display area and adjacent to the module hole, and recessed from the front surface of the base substrate, and wherein the electronic module overlaps the module hole in a plan view.

In an embodiment, the electronic module may include at least one of a voice output module, an image capturing module, and a light receiving module.

In an embodiment, the blocking groove may have a shape of a closed curve surrounding the module hole when viewed in a plane.

In an embodiment, the base substrate may include: a first base layer containing an organic material and including the rear surface of the base substrate; a first barrier layer containing an inorganic material and arranged on the first base layer to include the front surface of the base substrate; a second base layer containing an organic material and arranged between the first base layer and the first barrier layer, and a second barrier layer containing an inorganic material and arranged between the first base layer and the second base layer, and the blocking groove may pass through the first barrier layer, the second barrier layer, and the second base layer, and may be defined by a portion of the first base layer being recessed.

In an embodiment, the first barrier layer may protrude from the second base layer within the blocking groove, and the second barrier layer may protrude from the first barrier layer within the blocking groove.

In an embodiment, each of the plurality of pixels may include: a thin film transistor including a control electrode, an input electrode, an output electrode, and a semiconductor pattern; and an organic light emitting device including a first electrode connected to the thin film transistor, a second electrode on the first electrode, and an organic layer between the first electrode and the second electrode and comprising an organic light emitting layer, and the organic layer may include a portion including a first edge that is cut off along the module hole, and a second edge that is cut off along the blocking groove and overlapping the thin film transistor, and the portion including the first edge and the portion including the second edge may be spaced apart from each other with the blocking groove therebetween.

In an embodiment of the inventive concept, the electronic device may further include a sealing member on the organic light emitting device, and the sealing member may expose the first edge and cover the second edge.

In an embodiment, the sealing member may cover an inner surface of the blocking groove.

In an embodiment, the organic layer may be arranged within the blocking groove and further include organic portions that are separated from the portion including the first edge and the portion including the second edge, respectively, and each of the organic portions may be covered by the sealing member.

In an embodiment, the display panel may further include a cover layer extending from a layer arranged between the organic layer and the base substrate, containing an inorganic material, and including a passing-through portion overlapping the blocking groove.

In an embodiment, the width of the passing-through portion of the cover layer may be equal to or less than the width of the blocking groove.

In an embodiment, the second edge of the organic layer may be aligned with the passing-through portion of the cover layer.

According to one or more embodiments of the inventive concept, a display panel includes: a flexible substrate including a display area and a periphery area adjacent to the display area on a plane, and including a front surface, a rear surface, a first barrier layer defining the front surface, and a first base layer defining the rear surface; and an organic layer arranged in the display area and including an organic light emitting layer, wherein the flexible substrate includes: a module hole defined in the display area and passing through the first barrier layer and the first base layer; and a blocking groove defined in the display area and adjacent to the module hole, passing through the first barrier layer, and recessed from the front surface of the first barrier layer.

In an embodiment, the organic layer may include a first portion including a first edge cut off along the module hole, and a second portion including a second edge cut off along the blocking groove, and the first portion and the second portion may be spaced from each other with the blocking groove therebetween.

In an embodiment, the display panel may further include a sealing member arranged on the organic layer and including an inorganic layer, and the first edge may be exposed from the sealing member, and the second edge may be covered by the sealing member.

In an embodiment, a UV light absorption rate of the first barrier layer may be lower than a UV light absorption rate of the first base layer.

In an embodiment, the first barrier layer may protrude from the first base layer within the blocking groove.

BRIEF DESCRIPTION OF THE DRAWINGS

The accompanying drawings are included to provide a further understanding of the inventive concept, and are incorporated in and constitute a part of this specification. The drawings illustrate some exemplary embodiments of the inventive concept and, together with the description, serve to describe principles of the inventive concept. In the drawings:

FIGS. 12A to 12J are cross-sectional views illustrating a manufacturing method of a display panel according to an embodiment of the inventive concept.

DETAILED DESCRIPTION

Herein, some embodiments of the inventive concept are described in further detail with reference to the accompanying drawings.

Figure 1:
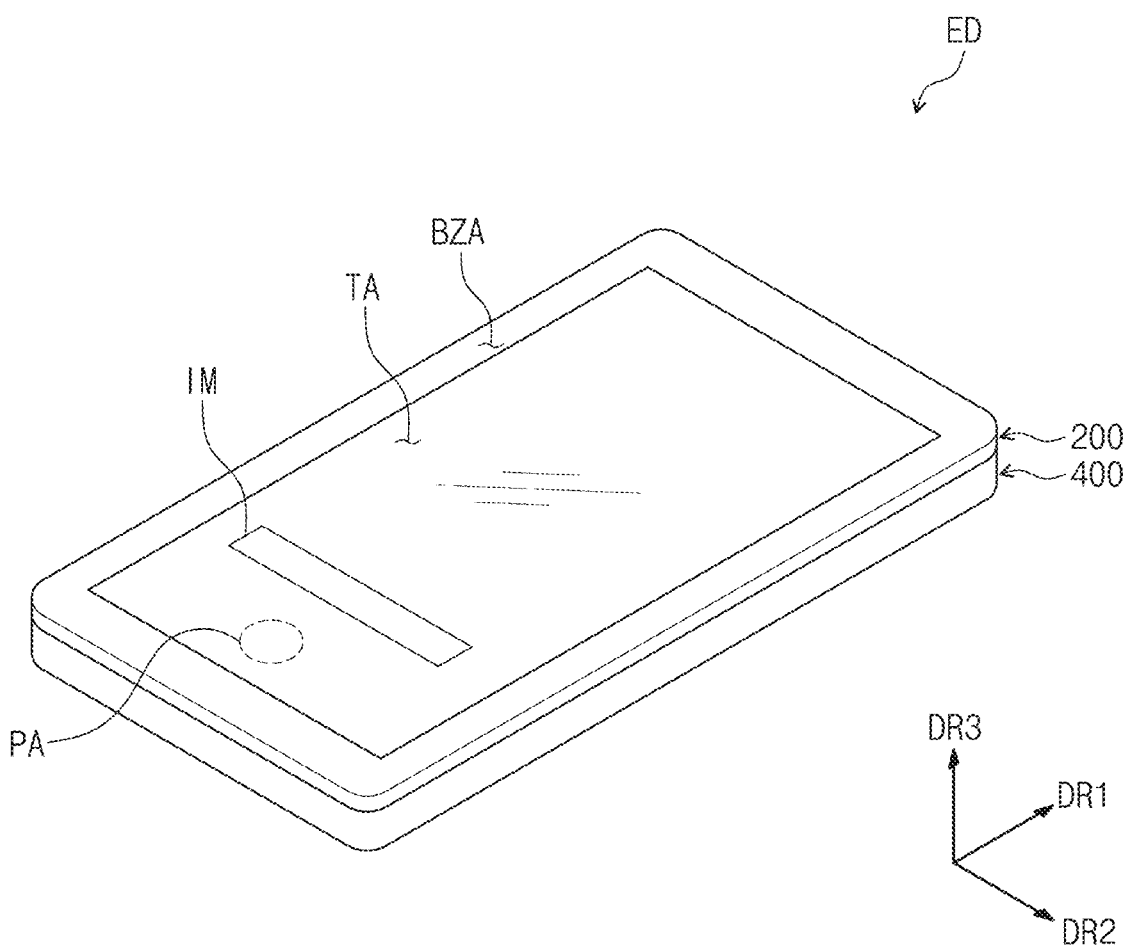
FIG. 1 is a perspective view illustrating an electronic device according to an embodiment of the inventive concept.
Figure 2:
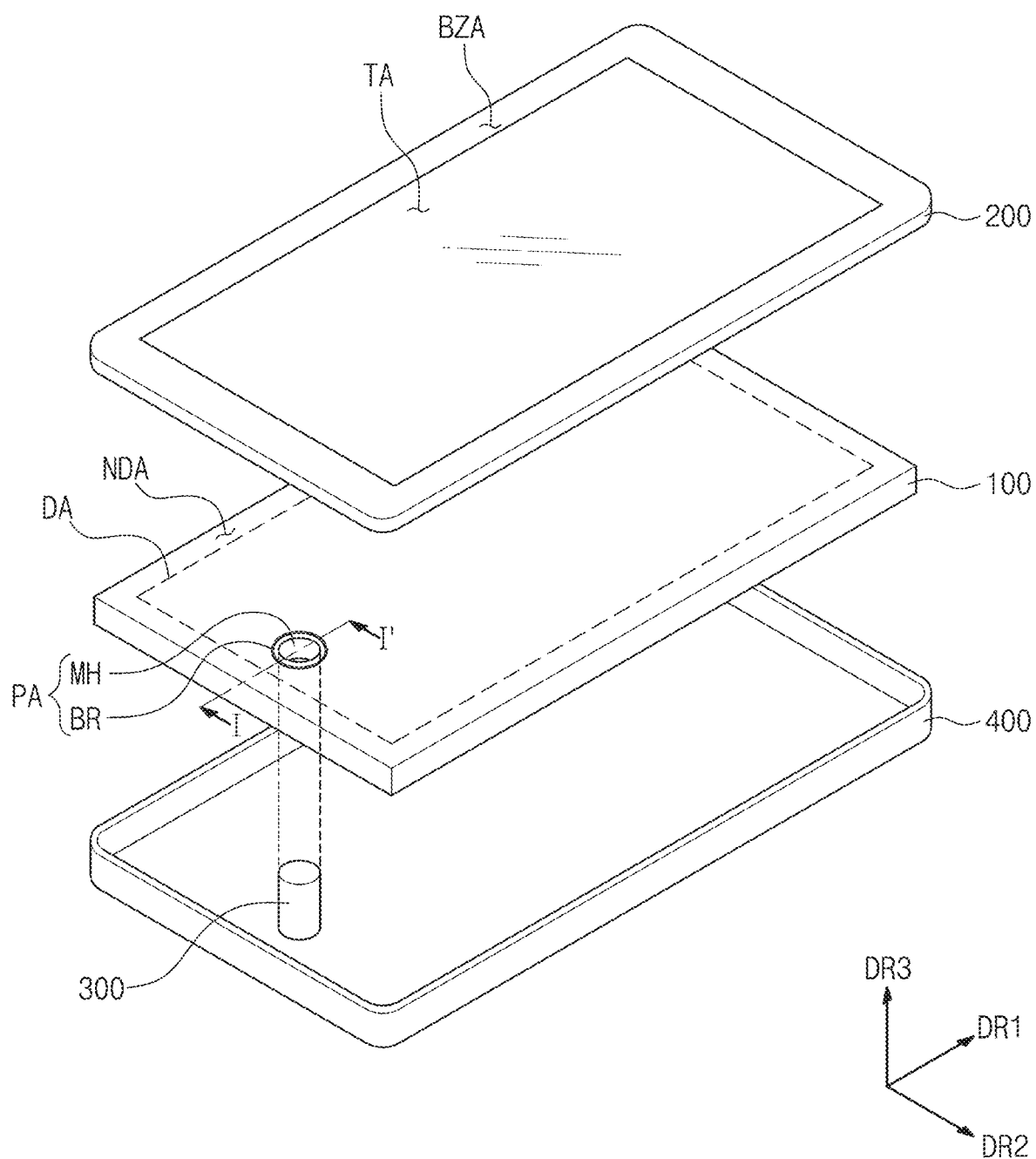
FIG. 2 is an exploded perspective view of the electronic device illustrated in FIG. 1.
Figure 3:
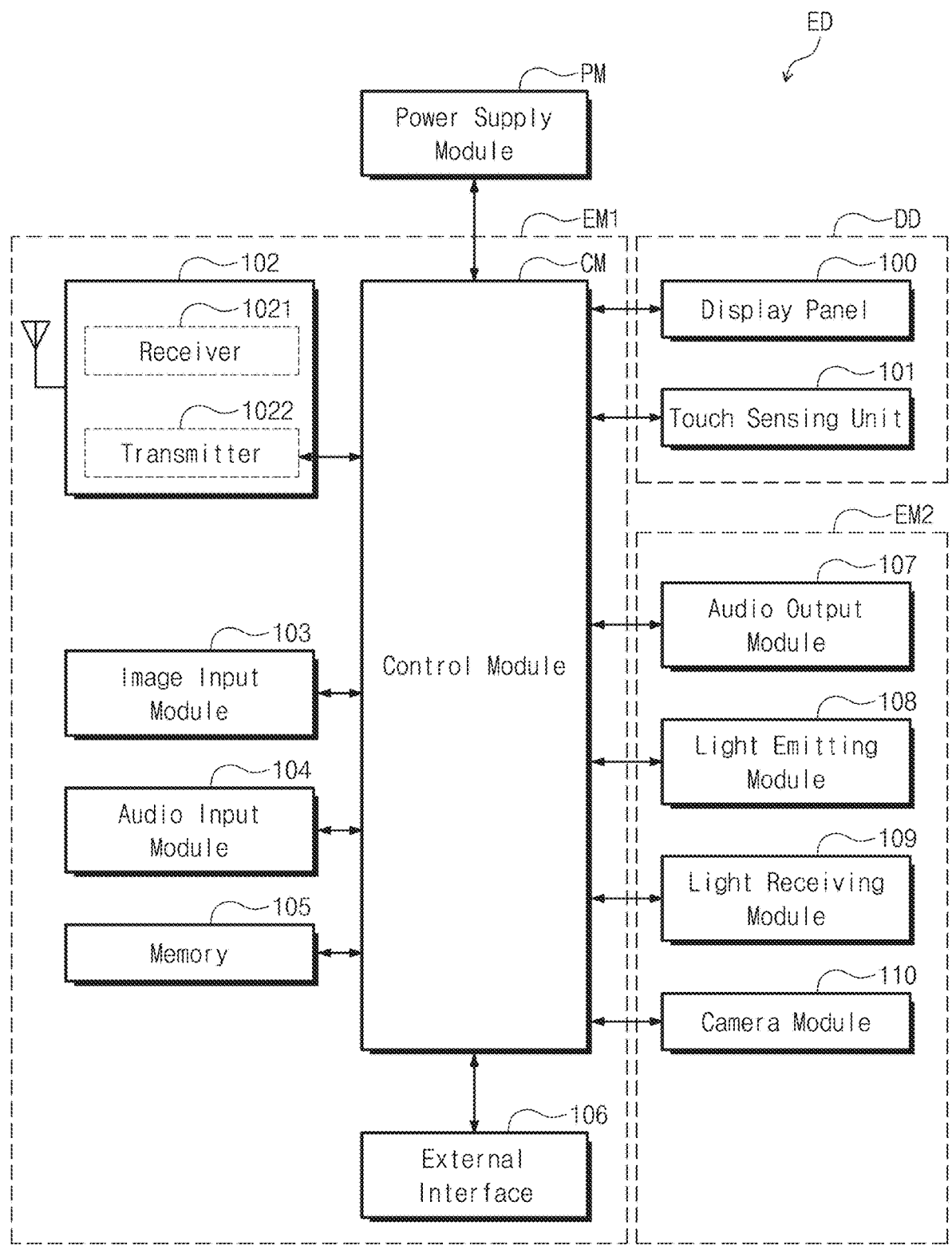
FIG. 3 is a block diagram of the electronic device illustrated in FIG. 1.

FIG. 1 is a perspective view illustrating an electronic device according to an embodiment of the inventive concept. FIG. 2 is an exploded perspective view of the electronic device illustrated in FIG. 1. FIG. 3 is a block diagram of the electronic device illustrated in FIG. 1. Herein, an electronic device according to an embodiment of the inventive concept will be described with reference to FIGS. 1 to 3.

An electronic device ED may be a device activated by an electronic signal. The electronic device ED may include any of various embodiments. For example, the electronic device ED may include any of a tablet, a notebook, a computer, a smart television, and the like. In an embodiment, the electronic device ED is exemplarily illustrated as a smartphone.

As shown in FIG. 1, the electronic device ED may provide a display surface for displaying an image IM on a front surface thereof. The display surface may be defined to be parallel to a surface defined by a first direction DR1 and a second direction DR2. The display surface includes a display area DA and a bezel area BZA adjacent to the display area DA.

The electronic device ED is configured to display the image IM in the display area DA. In FIG. 1, the display area DA may have a rectangular shape that is parallel to the first direction DR1 and the second direction DR2, respectively. However, this is an exemplary illustration, and the display area DA may have any of various shapes and is not limited to any one embodiment.

The bezel area BZA is adjacent to the display area DA. The bezel area BZA may surround the display area DA. However, this is an exemplary illustration, and the bezel area BZA may be disposed adjacent to one or more sides of the display area only, or may be omitted. The electronic device ED according to an embodiment of the inventive concept may include any of various embodiments, and is not limited to any one embodiment.

A normal direction of the display surface may correspond to a thickness direction DR3 (a third direction) of the electronic device ED. In this embodiment, the front surface (or the top surface) and the rear surface (or the bottom surfaces) of each member are defined based on a direction in which the image IM is displayed. The front surface and the rear surface are opposed or opposite to each other in the third direction DR3.

However, indicative directions of the first to third directions DR1, DR2, DR3 are a relative concept and may be changed to other directions. Herein, the first to third directions are directions respectively indicated by first to third directions DR1, DR2, DR3 and refer to same reference numerals.

As shown in FIGS. 1 to 3, in an embodiment, the electronic device ED includes a display panel 100, a window member 200, an electronic module 300, and a housing member 400. As shown in FIG. 3, the electronic device ED may further include a display module DD, a first electronic module EM1, a second electronic module EM2, and a power supply module PM. Some of configurations shown in FIG. 3 are omitted in FIG. 2.

The display module DD may include the display panel 100 and a touch sensing unit 101. The display panel 100 is configured to generate the image IM. The display panel 100 may sense a user input applied from the outside. Then, the display panel 100 may further include a touch sensor; however, the touch sensing unit 101 may be omitted.

The touch sensing unit 101 senses a user input applied from the outside. The user input may include any of various forms of external inputs, such as a portion of a user's body part, light, heat, or pressure. The touch sensing unit 101 is not shown in FIG. 2.

In an embodiment, the display panel 100 may be divided into the display area DA and a periphery area NDA. The display area DA may be an area in which the image IM is generated, as described above. A plurality of pixels PX (see FIG. 4) generating the image IM may be disposed in the display area DA. Further detailed description thereof will be described later herein.

The periphery area NDA is adjacent to the display area DA. In an embodiment, the periphery area NDA may surround the display area DA. A driving circuit or a driving line for driving the display area DA may be disposed in the periphery area NDA.

In an embodiment, although not illustrated, a portion of the periphery area NDA of the display panel 100 may be curved. Thereby, the portion of the periphery area NDA may be directed to the front surface of the electronic device ED, and the other portion of the periphery area NDA may be directed to the rear surface of the electronic device ED. Alternatively, the periphery area NDA may be omitted in the display panel 100 according to an embodiment of the inventive concept.

The display panel 100 according to an embodiment of the inventive concept may include a module part PA provided in the display area DA. The module part PA defines a space in which an electronic module 300 is disposed. The module part PA may include a module hole MH and a blocking groove BR.

The module hole MH passes through the display panel 100. In an embodiment, the module hole MH may have a cylindrical shape having a height in the third direction DR3. The electronic module 300 may overlap the module hole MH in a plan view. The module hole MH may accommodate the electronic module 300. In embodiments of the inventive concept, the display panel 100 may realize a thin display device by including the module hole MH.

The blocking groove BR is disposed adjacent to the module hole MH. The blocking groove BR may be formed by being recessed from the front surface of the display panel 100. In an embodiment, the blocking groove BR may have a shape of a closed curve surrounding the module hole MH in a plane. In an embodiment, the blocking groove BR may have a ring shape that surrounds the module hole MH. The module hole MH and the blocking groove BR will be described in further detail later herein.

The window member 200 provides the front surface of the electronic device ED. The window member 200 is disposed on the front surface of the display panel 100 to provide protection to the display panel 100. For example, the window member 200 may include a glass substrate, a sapphire substrate, or a plastic film. The window member 200 may have a multi-layered or single-layered structure. For example, the window member 200 may have a laminate structure of a plurality of plastic films that are bonded by an adhesive, or may have a laminate structure of a glass substrate and a plastic film that are bonded by an adhesive.

The window member 200 may be divided into a transmission area TA and the bezel area BZA. The transmission area TA may be an area corresponding to the display area DA. For example, the transmission area TA overlaps the front surface of the display area DA or at least a portion thereof. The image IM displayed in the display area DA of the display panel 100 may be viewed from the outside through the transmission area TA.

The bezel area BZA defines the shape of the transmission area TA. The bezel area BZA is adjacent to the transmission area TA, and, in an embodiment, may surround the transmission area TA. The bezel area BZA may have a color (e.g., a predetermined color). The bezel area BZA may cover the periphery area NDA of the display panel 100 to prevent or substantially prevent the periphery area NDA from being viewed from the outside. However, this is an exemplary illustration, and in the window member 200 according to an embodiment of the inventive concept, the bezel area BZA may be omitted.

The power supply module PM supplies power for overall operation of the electronic device ED. In an embodiment, the power supply module PM may include a conventional battery module.

The housing member 400 may be coupled to the window member 200. The housing member 400 provides the rear surface of the electronic device ED. The housing member 400 is coupled to the window member 200 to define an inner space, and the display panel 100, the electronic module 300, and each kind of configurations shown in FIG. 3 may be accommodated in the inner space. The housing member 400 may include a material having relatively high rigidity. For example, the housing member 400 may include a plurality of frames and/or plates composed of glass, plastic, and metal. The housing member 400 may provide stable protection to components of the electronic device ED accommodated in the inner space against an external impact.

The electronic module 300 includes any of various functional modules for operating the electronic device ED. In an embodiment, the electronic module 300 may include the first electronic module EM1 and the second electronic module EM2.

The first electronic module EM1 may be directly mounted on a motherboard that is electrically connected to the display module DD, or mounted on a separate substrate to be electrically connected to the motherboard through a connector (not shown).

In an embodiment, the first electronic module EM1 may include a control module CM, a wireless communication module 102, an image input module 103, an audio input module 104, a memory 105, and an external interface 106. However, some of the modules may not be mounted on the motherboard, and may also be connected to the motherboard through a flexible circuit substrate.

The control module CM controls overall operations of the electronic device ED. In an embodiment, the control module CM may be a microprocessor. For example, the control module CM may control other modules, such as the image input module 103 or the audio input module 104, based on a touch signal received from the display module DD.

In an embodiment, the wireless communication module 102 may transmit/receive a wireless signal to/from another terminal through a Bluetooth or Wi-Fi network. For example, the wireless communication module 102 may transmit/receive an audio signal through a conventional communication network. In an embodiment, the wireless communication module 102 includes a transmitter 1022 configured to modulate and transmit a transmission signal, and a receiver 1021 configured to demodulate a received signal.

The image input module 103 processes an image signal and converts the processed image signal to an image data that may be displayed on the display module DD. The audio input module 104 receives an external audio signal via a microphone in a recording mode, voice recognition mode, etc., and converts the received signal to an electrical voice data.

The external interface 106 serves as an interface to be connected with any of an external charger, wired/wireless data ports, card sockets (such as a memory card and a SIM/UIM card), etc.

In an embodiment, the second electronic module EM2 may include an audio output module 107, a light emitting module 108, a light receiving module 109, and a camera module 110. These configurations may either be directly mounted on the motherboard, or mounted on a separate substrate, thereby being electrically connected to the display module DD or electrically connected to the first electronic module EM1 through a connector (not shown), etc.

The audio output module 107 converts an audio data received from the wireless communication module 102 or an audio data stored in the memory 105 and outputs the converted audio data to the outside.

The light emitting module 108 generates and outputs light. The light emitting module 108 may output infrared rays. The light emitting module 108 may include a light emitting diode (LED) device, for example. The light receiving module 109 may sense infrared rays. In an embodiment, the light receiving module 109 may be activated when infrared rays of a predetermined level or greater are sensed. The light receiving module 109 may include a CMOS sensor, for example. After infrared light generated by the light emitting module 108 is output, the infrared light may be reflected by an external object (such as a user's finger or a face), and the reflected infrared light may be incident in the light receiving module 109. The camera module 110 captures an external image.

The electronic module 300 illustrated in FIG. 2 may include any of the configurations of the second electronic module EM2. Here, the rest of configurations of the first electronic module EM1 and the second electronic module EM2 may be disposed in different positions and may not be shown. However, this is an exemplary illustration, and the electronic module 300 may be any one of the modules constituting the first electronic module EM1 and the second electronic module EM2, and is not limited to any one embodiment.

Figure 4:
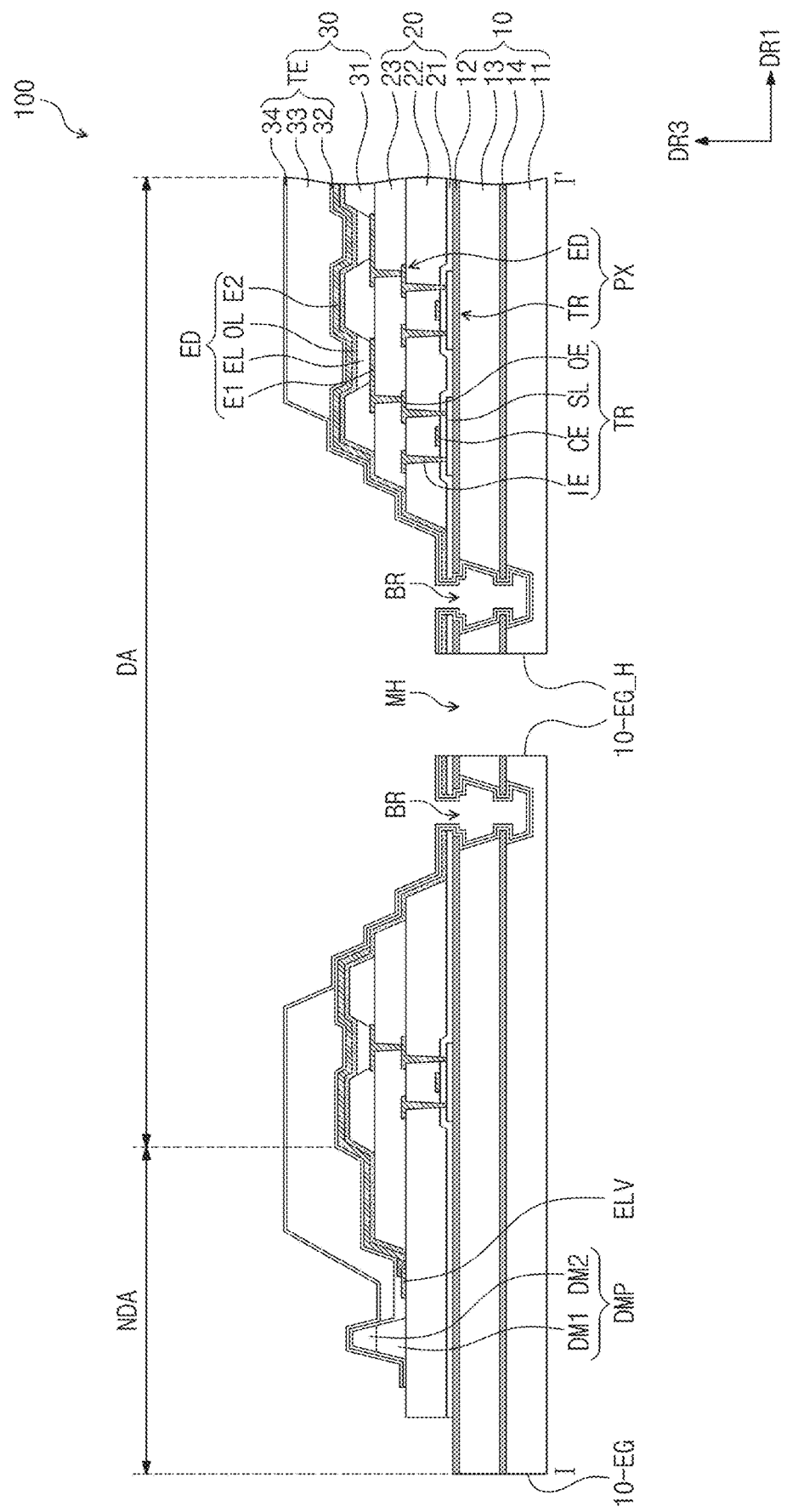
FIG. 4 is a cross-sectional view taken along the line I-I' of FIG. 2.
Figure 5:
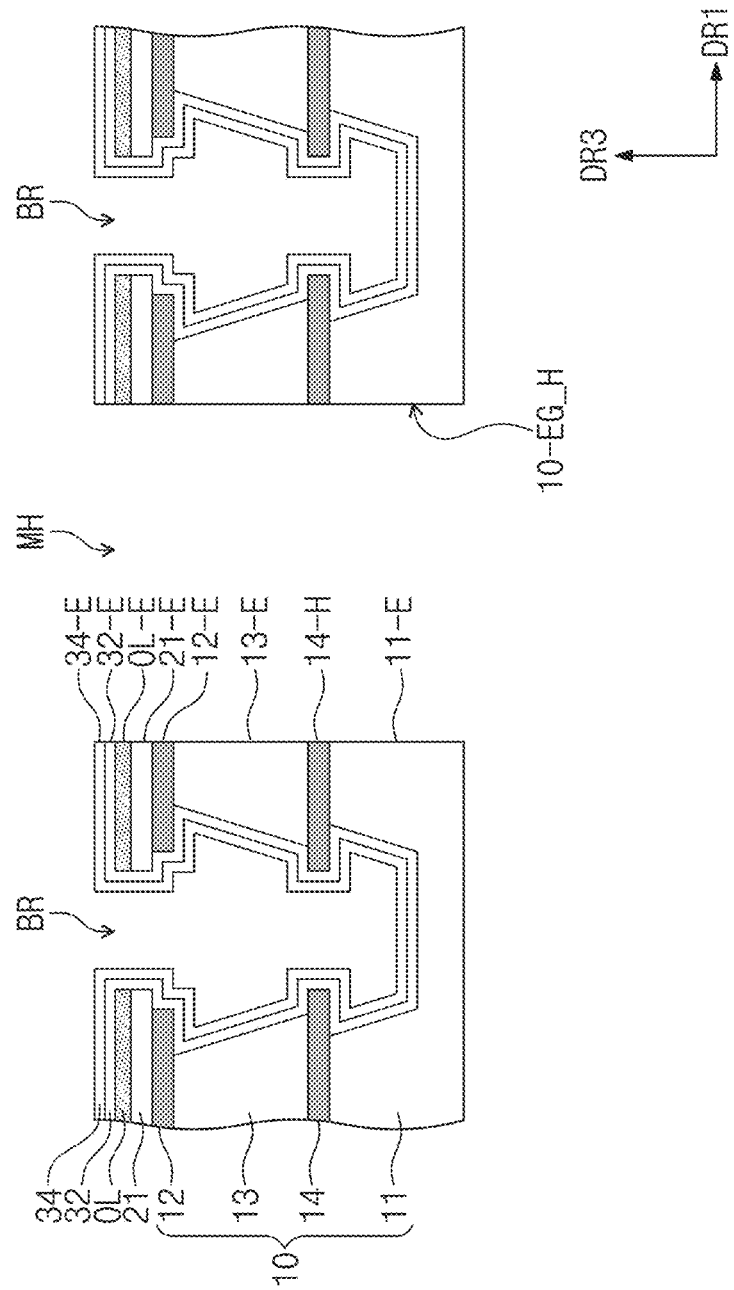
FIG. 5 is an enlarged cross-sectional view illustrating a portion of FIG. 4.
Figure 6:
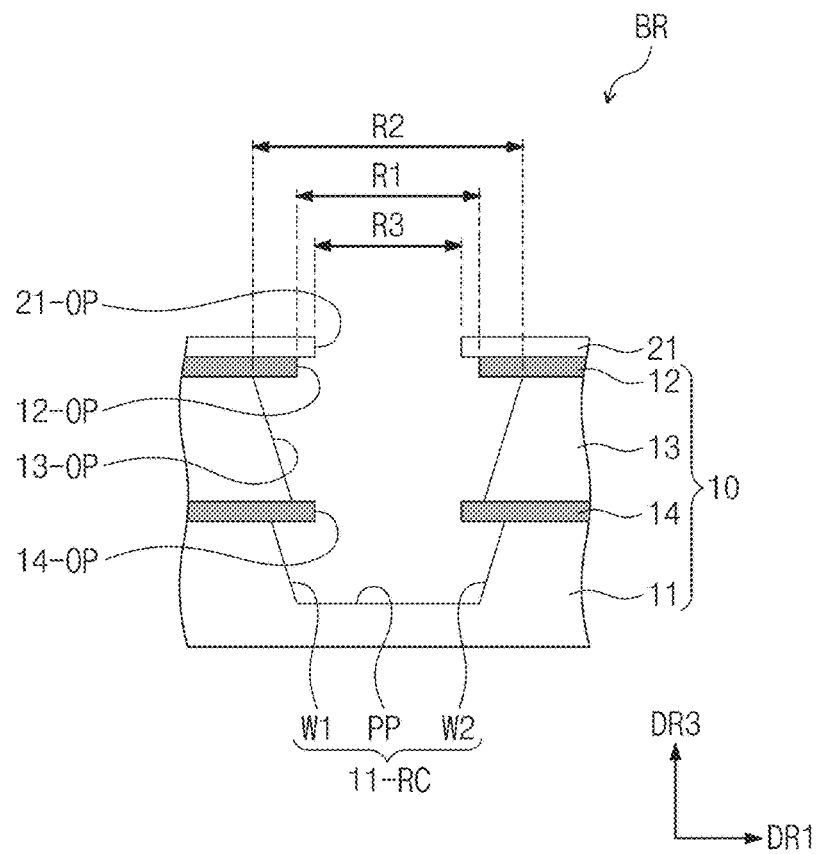
FIG. 6 is an enlarged cross-sectional view illustrating a portion of FIG. 5.

FIG. 4 is a cross-sectional view taken along the line I-I' of FIG. 2. FIG. 5 is an enlarged cross-sectional view illustrating a portion of FIG. 4. FIG. 6 is an enlarged cross-sectional view illustrating a portion of FIG. 5. Herein, a display panel 100 according to an embodiment of the inventive concept will be described with reference to FIGS. 4 to 6.

As shown in FIG. 4, the display panel 100 includes a base substrate 10, a thin film device layer 20, and a display device layer 30. The base substrate 10, the thin film device layer 20, and the display device layer 30 may be laminated along the third direction DR3.

In an embodiment, the base substrate 10 may include a first base layer 11, a first barrier layer 12, a second base layer 13, and a second barrier layer 14.

The first base layer 11 constitutes a bottom layer of the base substrate 10. The rear surface of the first base layer 11 may define the rear surface of the base substrate 10.

The first base layer 11 may be an insulation layer containing an organic material. In an embodiment, the first base layer 11 may include a ductile plastic. For example, the first base layer 11 may include polyimide (PI), polyethylene naphthalate (PEN), polyethylene terephthalate (PET), polyarylate, polycarbonate (PC), polyetherimide (PEI) or polyethersulfone (PES).

The first barrier layer 12 may include an inorganic material. The first barrier layer 12 constitutes the top layer of the base substrate 10. The front surface of the first barrier layer 12 may define the front surface of the base substrate 10.

The first barrier layer 12 may be an insulation layer containing an inorganic material. For example, the first barrier layer 12 may include silicon oxide, silicon nitride, amorphous silicon, or the like.

The second base layer 13 and the second barrier layer 14 may be disposed between the first base layer 11 and the first barrier layer 12. In an embodiment, the second base layer 13 may include the same material as the first base layer 11. In an embodiment, the second barrier layer 14 may include the same material as the first barrier layer 12.

The first base layer 11, the second base layer 13, the first barrier layer 12, and the second barrier layer 14 may be alternately disposed. The first barrier layer 12 and the second barrier layer 14 may be respectively disposed on the second base layer 13 and the first base layer 11. Each of the first barrier layer 12 and the second barrier layer 14 may block external moisture or oxygen that is transmitted through the first base layer 11 and the second base layer 13.

The thin film device layer 20 is disposed on the base substrate 10. The thin film device layer 20 includes a plurality of insulation layers and a thin film transistor TR. Each of the insulation layers may include an inorganic material and/or an organic material. The insulation layers may include first to third insulation layers 21, 22, and 23.

The thin film transistor TR includes a semiconductor pattern SL, a control electrode CE, an input electrode IE, and an output electrode OE. The thin film transistor TR controls charge transfer in the semiconductor pattern SL through the control electrode CE to output an electric signal inputted from the input electrode IE, through the output electrode OE.

The first insulation layer 21 may be disposed between the semiconductor pattern SL and the control electrode CE. In this embodiment, the control electrode CE is illustrated as being disposed on the semiconductor pattern SL. However, this is an exemplary illustration, and the thin film transistor TR according to an embodiment of the inventive concept may include the semiconductor pattern SL being disposed on the control electrode CE, and is not limited to any one embodiment.

The second insulation layer 22 may be disposed between the control electrode CE, the input electrode IE, and the output electrode OE. The input electrode IE and the output electrode OE are disposed on the second insulation layer 22. The input electrode IE and the output electrode OE pass through the first insulation layer 21 and the second insulation layer 22 to be connected to the semiconductor pattern SL, respectively. However, this is an exemplary illustration, and the input electrode IE and the output electrode OE may be directly connected to the semiconductor pattern SL.

The third insulation layer 23 is disposed on the second insulation layer 22. The third insulation layer 23 may cover the thin film transistor TR. The third insulation layer 23 electrically insulates the thin film transistor TR and the display device layer 30 from each other.

In an embodiment, the display device layer 30 includes an organic light emitting device ED and a plurality of insulation layers. The insulation layers may include a fourth insulation layer 31 and a sealing member TE.

The fourth insulation layer 31 is disposed on the third insulation layer 23. A plurality of openings may be defined in the fourth insulation layer 31. Each of the openings may be provided with the organic light emitting device ED.

The organic light emitting device ED include a first electrode E1, a second electrode E2, a light emitting layer EL, and a charge control layer OL. The first electrode E1 is disposed on the thin film device layer 20. The first electrode E1 may pass through the third insulation layer 23 to be electrically connected to the thin film transistor TR. The first electrode E1 may be provided in plurality. At least some of each of a plurality of the first electrodes may be exposed by each of the openings.

The second electrode E2 is disposed on the first electrode E1. The second electrode E2 may have an integral shape overlapping the plurality of first electrodes and the fourth insulation layer 31. When the organic light emitting device is provided in plurality, the second electrode E2 may have the same voltage for each organic light emitting device. Accordingly, a separate patterning process for forming the second electrode E2 may be omitted. However, this is an exemplary illustration, and the second electrode E2 may be provided in plurality to correspond to each of the openings.

The light emitting layer EL is disposed between the first electrode E1 and the second electrode E2. The light emitting layer EL may be provided in plurality to be disposed in each of the openings. The organic light emitting device ED may activate the light emitting layer EL based on a potential difference between the first electrode E1 and the second electrode E2, thereby generating light.

The charge control layer OL is disposed between the first electrode E1 and the second electrode E2. The charge control layer OL is disposed adjacent to the light emitting layer EL. In this embodiment, the charge control layer OL is illustrated as being disposed between the light emitting layer EL and the second electrode E2. However, this is an exemplary illustration, and the charge control layer OL may be disposed between the light emitting layer EL and the first electrode E1, or may be provided in a plurality of layers laminated along the third direction DR3 with the light emitting layer EL therebetween.

In an embodiment, the charge control layer OL may have an integral shape overlapping the front surface of the base substrate 10 without a separate patterning process. The charge control layer OL may be disposed in an area other than the openings formed in the fourth insulation layer 31.

The sealing member TE is disposed on the organic light emitting device ED. The sealing member TE may include an inorganic film and/or an organic film. In an embodiment, the sealing member TE may include a first inorganic film 32, an organic film 33, and a second inorganic film 34.

Each of the first inorganic film 32 and the second inorganic film 34 may include an inorganic material. For example, each of the first inorganic film 32 and the second inorganic film 34 may include at least any of aluminum oxide, silicon oxide, silicon nitride, silicon oxynitride, silicon carbide, titanium oxide, zirconium oxide, and zinc oxide.

The organic film 33 may be disposed between the first inorganic film 32 and the second inorganic film 34. The organic film 33 may include an organic material. For example, the organic film 33 may include at least any of epoxy, polyimide (PI), polyethylene terephthalate (PET), polycarbonate (PC), polyethylene (PE), and polyacrylate.

In an embodiment, the first inorganic film 32 and the second inorganic film 34 may have an integral shape disposed on the front surface of the display panel 100. In an embodiment, each of the first inorganic film 32 and the second inorganic film 34 may partially overlap the organic film 33. Accordingly, the first inorganic film 32 and the second inorganic film 34 may be spaced from each other in the third direction DR3 with the organic film 33 interposed therebetween in some area, and may directly contact with each other in the third direction DR3 in some other area.

The display panel 100 may include a dam part DMP. The dam part DMP may extend along an edge of the display area DA (refer to FIG. 2). In an embodiment, the dam part DMP may surround the display area DA.

In an embodiment, the dam part DMP may include a first dam DM1 and a second dam DM2. The first dam DM1 may include the same material as the third insulation layer 23. The first dam DM1 may be concurrently (e.g., simultaneously) formed with the third insulation layer 23, and may be disposed on the same layer with the third insulation layer 23.

In an embodiment, the second dam DM2 is laminated on the first dam DM1. The second dam DM2 may include the same material as the fourth insulation layer 31. The second dam DM2 may be concurrently (e.g., simultaneously) formed with the fourth insulation layer 31, and may be disposed on the same layer with the fourth insulation layer 31. However, this is an exemplary illustration, and the dam part DMP may have a single layer structure, and is not limited to any one embodiment.

The dam part DMP may define an area in which a liquid organic material is spread in a process of forming the organic film 33. In an embodiment, the organic film 33 may be formed by applying the liquid organic material onto the first inorganic film 32 in an inkjet method, and, at this time, the dam part DMP sets a boundary of an area in which the liquid organic material is disposed, and prevents or substantially prevents the liquid organic material from overflowing outside the dam part DMP.

Herein, an area in which the module hole MH and the blocking groove BR are defined will be described in further detail with reference to FIGS. 5 and 6. In FIG. 6, the first inorganic film 32 and the second inorganic film 34 are omitted from the illustration for the convenience of description. The module hole MH passes through the display panel 100 along the third direction DR3. As the module hole MH is defined in the display area DA, the module hole MH passes through not only the base substrate 10, but also a portion of layers constituting the display area DA as well.

The module hole MH passes through the base substrate 10. An inner surface 10-EG_H of the module hole MH may be defined by edges of the plurality of layers. An edge of the first base layer 11-E, an edge of the first barrier layer 12-E, an edge of the second base layer 13-E, and an edge of the second barrier layer 14-E may be defined on the first base layer 11, the first barrier layer 12, the second base layer 13, and the second barrier layer 14, respectively.

Further, the module hole MH passes through at least a portion of the layers constituting the display area DA. For example, the module hole MH may pass through the first insulation film 21, the charge control layer OL, the first inorganic film 32, and the second inorganic film 34. Accordingly, an edge of the first insulation film 21-E, an edge of the charge control layer OL-E, an edge of the first inorganic film 32-E, and an edge of the second inorganic layer 34-E may be defined on the first insulation film 21, the charge control layer OL, the first inorganic film 32, and the second inorganic film 34, respectively.

In an embodiment, the edge of the first base layer 11-E, the edge of the first barrier layer 12-E, the edge of the second base layer 13-E, the edge of the second barrier layer 14-E, the edge of the first insulation film 21-E, the edge of the charge control layer OL-E, the edge of the first inorganic film 32-E, and the edge of the second inorganic film 34-E may be aligned along the third direction DR3. Accordingly, the module hole MH may have a cylindrical shape having a height along the third direction DR3. However, this is an exemplary illustration, and at least some portions of the edges of the respective layers defining the module hole MH may not be aligned with each other, and are not limited to any one embodiment.

The blocking groove BR is defined adjacent to the module hole MH. The blocking groove BR may be spaced in the first direction DR1 from the module hole MH. The blocking groove BR may be recessed from the front surface of the base substrate 10 in the third direction DR3. Accordingly, the blocking groove BR passes through the front surface of the base substrate 10 but does not pass through the rear surface thereof.

In an embodiment, the blocking groove BR may be formed by eliminating at least some portions of the base substrate 10. For example, the blocking groove BR may be formed by eliminating at least some portions of the first base layer 11, the first barrier layer 12, the second base layer 13, and the second barrier layer 14.

The blocking groove BR according to an embodiment of the inventive concept is defined in the base substrate 10 and includes an inner surface having an undercut shape. The blocking groove BR may include a recessed portion 11-RC and at least one passing-through portion. The recessed portion 11-RC and the at least one passing-through portion form the undercut shape on the inner surface of the blocking groove BR. In an embodiment, the blocking groove BR may include a passing-through portion 12-OP passing through the first barrier layer 12, a passing-through portion 13-OP passing through the second base layer 13, and a passing-through portion 14-OP passing through the second barrier layer 14.

The recessed portion 11-RC is defined in the first base layer 11. The recessed portion 11-RC may be recessed from the front surface of the first base layer 11. The recessed portion 11-RC includes a plane surface PP, a first side surface W1, and a second side surface W2. Although the first side surface W1 and the second side surface W2 are separately illustrated for ease of explanation, the first side surface W1 and the second side surface W2 may be a surface integrally connected to each other.

The plane surface PP may be a recessed surface in the rear surface direction from the front surface of the first base layer 11. The plane surface PP is spaced from the rear surface of the first base layer 11 in the third direction DR3. Each of the first side surface W1 and the second side surface W2 is connected to the plane surface PP. The first side surface W1 and the second side surface W2 may be inclined from the plane surface PP. An angle formed by the first side surface W1 and the second side surface W2 within the recessed portion 11-RC may be equal to or greater than 90 degrees.

The passing-through portion 14-OP of the second barrier layer, the passing-through portion 13-OP of the second base layer, and the passing-through portion 12-OP of the first barrier layer may be disposed by being laminated in a direction orienting the front surface from the rear surface of the base substrate 10. Here, the passing-through portion 14-OP of the second barrier layer and the recessed portion 11-RC form the undercut shape, and the passing-through portion 12-OP of the first barrier layer and the passing-through portion 13-OP of the second base layer may form the undercut shape.

The second barrier layer 14 protrudes inside the recessed portion 11-RC to cover at least a portion of the recessed portion 11-RC. The width of the passing-through portion 14-OP of the second barrier layer in the first direction DR1 may be less than the width of the recessed portion 11-RC in the first direction DR1. The width of the recessed portion 11-RC in the first direction DR1 may be a length of the recessed portion 11-RC measured closest to the second barrier layer 14.

The first barrier layer 12 protrudes inside the passing-through portion 13-OP of the second base layer to cover at least a portion of the passing-through portion 13-OP of the second base layer. A width R1 of the passing-through portion 12-OP of the first barrier layer in the first direction DR1 may be less than a width R2 of the passing-through portion 13-OP of the second base layer in the first direction DR1.

The passing-through portion 13-OP of the second base layer may have different planar areas along the third direction DR3. The width of the passing-through portion 13-OP of the second base layer in the first direction DR1 may be less on a rear surface than on a front surface thereof. In an embodiment, the passing-through portion 13-OP of the second base layer may have a conical shape. However, this is an exemplary illustration, and the passing-through portion 13-OP of the second base layer may have a pyramidal shape or an elliptical conical shape corresponding to a shape of the blocking groove BR on the plane, and is not limited to any one embodiment.

The thin film device layer 20 and the display device layer 30 may partially overlap the blocking groove BR. For example, the first insulation layer 21 may extend adjacent to the blocking groove BR to partially overlap the blocking groove BR. The first insulation layer 21 covers at least a portion of the blocking groove BR. The first insulation layer 21 may include a passing-through portion 21-OP defined in an area corresponding to the blocking groove BR. The passing-through portion 21-OP of the first insulation layer overlaps the blocking groove BR.

In this embodiment, a width R3 of the passing-through portion 21-OP of the first insulation layer in the first direction DR1 may be equal to or less than the width R1 of the passing-through portion 12-OP of the first barrier layer in the first direction DR1. The passing-through portion 21-OP of the first insulation layer may be aligned with the passing-through portion 12-OP of the first barrier layer, or may protrude inside the passing-through portion 12-OP of the first barrier layer. Accordingly, an undercut shape may be formed between the passing-through portion 21-OP of the first insulation layer and the passing-through portion 12-OP of the first barrier layer.

The charge control layer OL may be disposed to extend to an area adjacent to the module hole MH and an area adjacent to the blocking groove BR. The charge control layer OL may not overlap the blocking groove BR. Accordingly, the charge control layer OL may have an edge that is cut off adjacent to the blocking groove BR.

Each of the first inorganic film 32 and the second inorganic film 34 may extend to an area in which the blocking groove BR is disposed. The first inorganic film 32 and the second inorganic film 34 may be disposed along the area adjacent to the blocking groove BR and the inner surface of the blocking groove BR. Accordingly, the inside of the blocking groove BR may be covered by the first inorganic film 32 and the second inorganic film 34.

According to an embodiment of the inventive concept, the charge control layer OL may have an edge that is cut off in an area adjacent to the blocking groove BR, and overlap the blocking groove BR. The edge of the charge control layer OL that is cut off adjacent to the charge control layer OL is covered by the first inorganic film 32 and the second inorganic film 34.

As shown in FIGS. 4 and 5, the base substrate 10, the thin film device layer 20, and the display device layer 30 have cut off edges, respectively, in the area adjacent to the module hole MH. The cut off edges are exposed through the module hole MH. Moisture or oxygen outside the display panel 100 may be introduced to the base substrate 10, the thin film device layer 20, and the display device layer 30 through the exposed edges.

According to an embodiment of the inventive concept, an inflow path of oxygen or moisture being introduced from the module hole MH may be blocked by defining the blocking groove BR adjacent to the module hole MH. As shown in FIG. 5, the charge control layer OL, the edge of which is exposed by the module hole MH, is cut off without extending to the blocking groove BR. The blocking groove BR separates a portion disposed between the module hole MH and the blocking groove BR from a portion disposed outside the blocking groove BR. Accordingly, although external oxygen or moisture is introduced through the module hole MH, the introduced oxygen or moisture is not introduced outside the blocking groove BR, thereby stably preventing or substantially preventing damage to the thin film device layer 20 or the display device layer 30 existing outside the blocking groove BR.

Further, according to an embodiment of the inventive concept, the first inorganic film 32 and the second inorganic film 34 cover between the module hole MH and the blocking groove BR, the inside of the blocking groove BR, and the outside of the blocking groove BR. The charge control layer OL or the first insulation layer 21 that is cut off adjacent to the blocking groove BR is covered by the first inorganic film 32 and the second inorganic film 34. Accordingly, the degree of blocking of introduction of moisture or oxygen may be improved.

Figure 7:
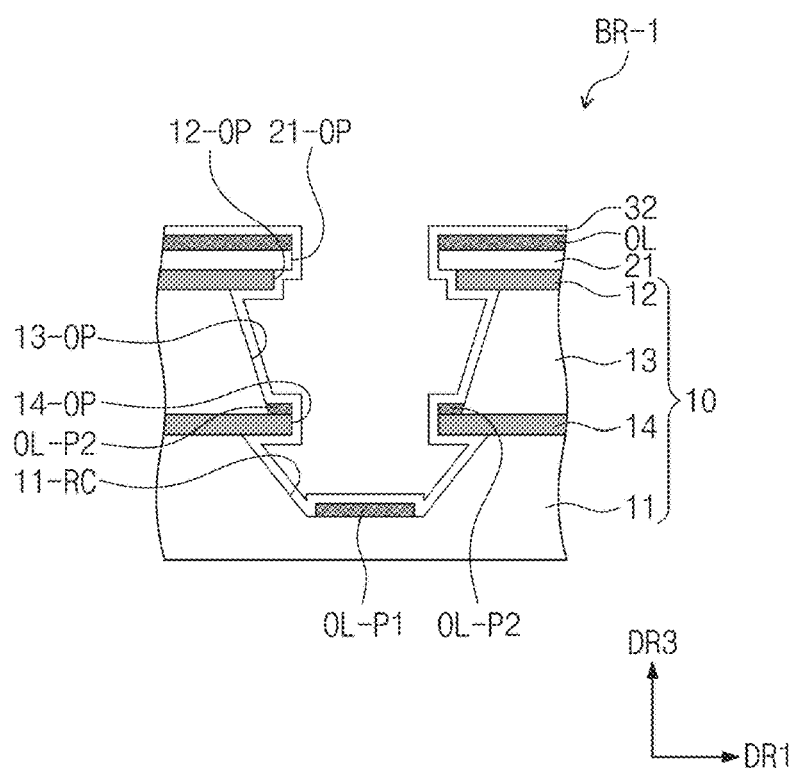
FIG. 7 is an enlarged cross-sectional view illustrating a portion of an electronic device according to an embodiment of the inventive concept.

FIG. 7 is an enlarged cross-sectional view illustrating a portion of an electronic device according to an embodiment of the inventive concept. In FIG. 7, some configurations are omitted for ease of explanation. Herein, an electronic device according to an embodiment of the inventive concept will be described with reference to FIG. 7. Same reference numerals are given to same or like configurations set forth in FIGS. 1 to 6, and duplicated description thereof will be omitted.

As shown in FIG. 7, at least a portion of the charge control layer OL may be disposed in a blocking groove BR-1. In an embodiment, the charge control layer OL may further include a first portion OL-P1 and a second portion OL-P2 that are disposed in the blocking groove BR-1.

The first portion OL-P1 may be disposed on a recessed portion 11-RC defined in the first base layer 11. The first portion OL-P1 may be disposed in a portion exposed from the second barrier layer 14. The width of the first portion OL-P1 in the first direction DR1 may be equal to or less than the width of the passing-through portion 14-OP of the second barrier layer in the first direction DR1.

The second portion OL-P2 may be disposed on the second barrier layer 14. The second portion OL-P2 may be disposed on a portion of the second barrier layer 14 that is exposed from the second base layer 13. The second portion OL-P2 may be disposed on a portion of the second barrier layer 14 that protrudes more inward of the blocking groove BR-1 than the second base layer 13.

The first portion OL-P1 and the second portion OL-P2 may be cut off or spaced from each other. Further, the first portion OL-P1 and the second portion OL-P2 may be cut off or spaced from the charge control layer OL disposed on the first insulation layer 21.

The first inorganic film 32 covers the inner surface of the blocking groove BR-1. In an embodiment, each of the first portion OL-P1 and the second portion OL-P2 may be covered by the first inorganic film 32. Accordingly, the first portion OL-P1 and the second portion OL-P2 may be prevented or substantially prevented from being separated from the first base layer 11 or the second barrier layer 14.

According to an embodiment of the present disclosure, an inflow path of external contamination may be stably blocked by providing the first blocking groove BR-1 in the base substrate 10. Further, although some portions of the layer remain in the blocking groove BR-1, the portions may be stably fixed through the first inorganic film 32, thereby preventing or substantially preventing device damage caused by floating of the portions. Accordingly, reliability of the electronic device may be improved.

Figure 8A:
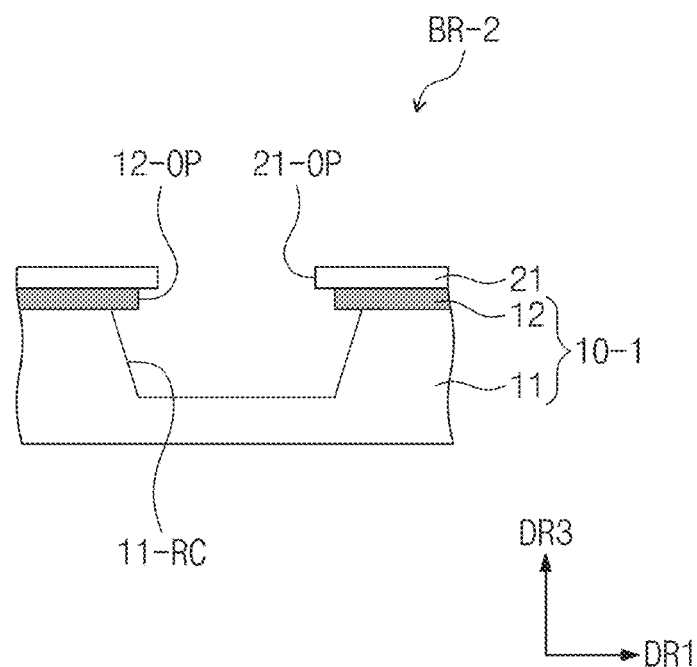
FIG. 8A and FIG. 8B are enlarged cross-sectional views illustrating a portion of an electronic device according to an embodiment of the inventive concept.
Figure 8B:
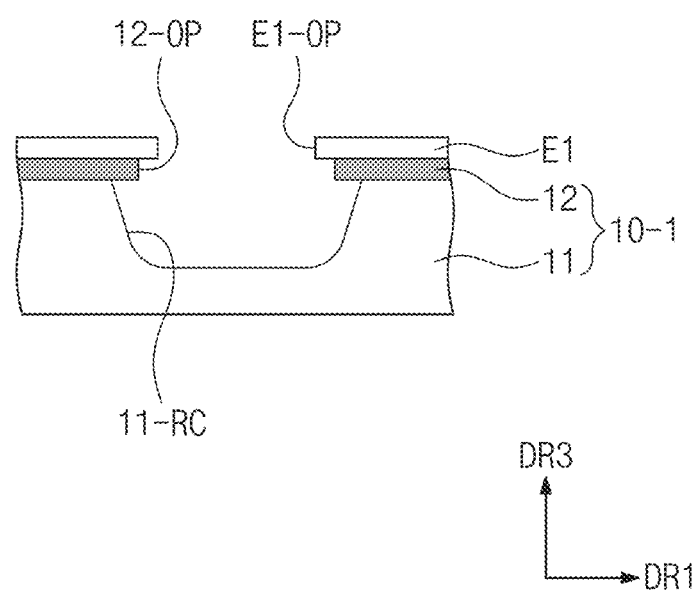
Figure 9:
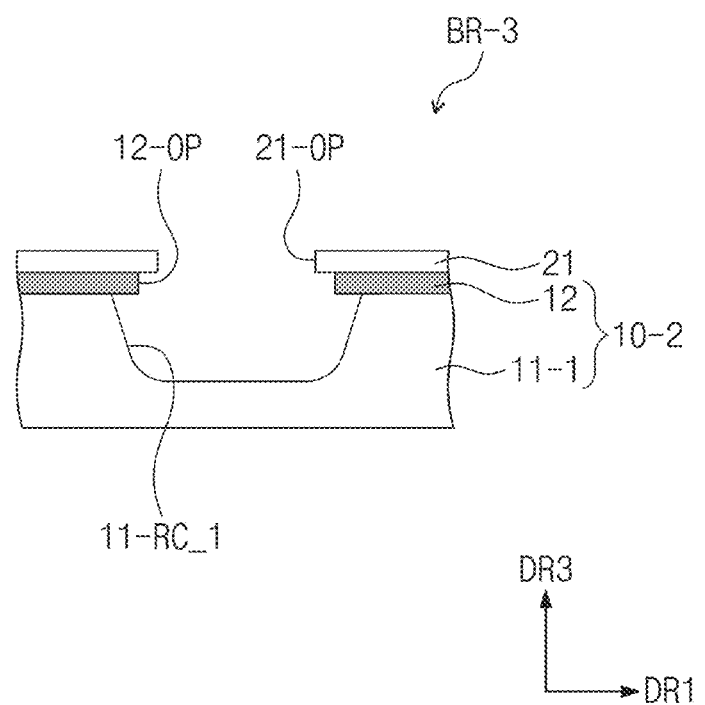
FIG. 9 is an enlarged cross-sectional view illustrating a portion of an electronic device according to an embodiment of the inventive concept.

FIG. 8A and FIG. 8B are enlarged cross-sectional views illustrating a portion of an electronic device according to an embodiment of the inventive concept. FIG. 9 is an enlarged cross-sectional view illustrating a portion of an electronic device according to an embodiment of the inventive concept. In FIGS. 8A to 9, blocking grooves BR-2, BR-3 having various shapes are mainly illustrated. Herein, embodiments of the inventive concept will be described with reference to FIGS. 8A to 9. Same reference numerals are given to same configurations set forth in FIGS. 1 to 7, and a duplicated description will be omitted.

As shown in FIGS. 8A and 8B, a base substrate 10-1 may include a first base layer 11 and a first barrier layer 12. A recessed potion 11-RC may be defined in the first base layer 11.

The first barrier layer 12 may be directly disposed on the front surface of the first base layer 11. The first barrier layer 12 may contact the first base layer 11.

A passing-through portion 12-OP may be defined in the first barrier layer 12. In an embodiment, the blocking groove BR-2 may include the recessed portion 11-RC and the passing-through portion 12-OP of the first barrier layer. The passing-through portion 12-OP of the first barrier layer may form an undercut shape (e.g., a predetermined undercut shape) with the recessed portion 11-RC. Here, an undercut shape defined by the passing-through portion 12-OP and the recessed portion 11-RC may be defined on the inner surface of the blocking groove BR-2.

As shown in FIG. 8B, the first electrode E1 may be a layer covering the blocking groove BR-2. Here, the first electrode E1 may be disposed further in an area adjacent to the blocking groove BR-2 in addition to the plurality of openings described above. In an embodiment, a passing-through portion E1-OP overlapping the blocking groove BR-2 may be defined in the first electrode E1. The width of the passing-through portion E1-OP of the first electrode E1 in the first direction DR1 may be equal to or less than the width of the passing-through portion 12-OP of the second barrier layer in the first direction.

In an embodiment, although not illustrated, a layer in which a passing-through portion disposed on the second barrier layer 12 to overlap the blocking groove BR-2 is defined may include any of various layers constituting the thin film device layer 20 and the display device layer 30. Further, although not illustrated, the layer in which the passing-through portion overlapping the blocking groove BR-2 is defined may also be provided in plurality.

As shown in FIG. 9, a base substrate 10-2 may include a first base layer 11-1 and the first barrier layer 12. A recessed portion 11-RC_1 may be defined in the first base layer 11-1. The recessed portion 11-RC_1 may have a curved (e.g., a predetermined curved) surface. Accordingly, the blocking groove BR-3 may include a curved surface in the inner surface thereof.

The electronic device according to embodiments of the inventive concept may include blocking grooves having any of various shapes. Further, the electronic device may form a layer for covering the blocking groove through any of various layers. Accordingly, a process may be simplified and a process cost may be reduced by utilizing a portion of existing display panel configurations without adding a separate process. Further detailed description thereof will be described later herein.

Figure 10:
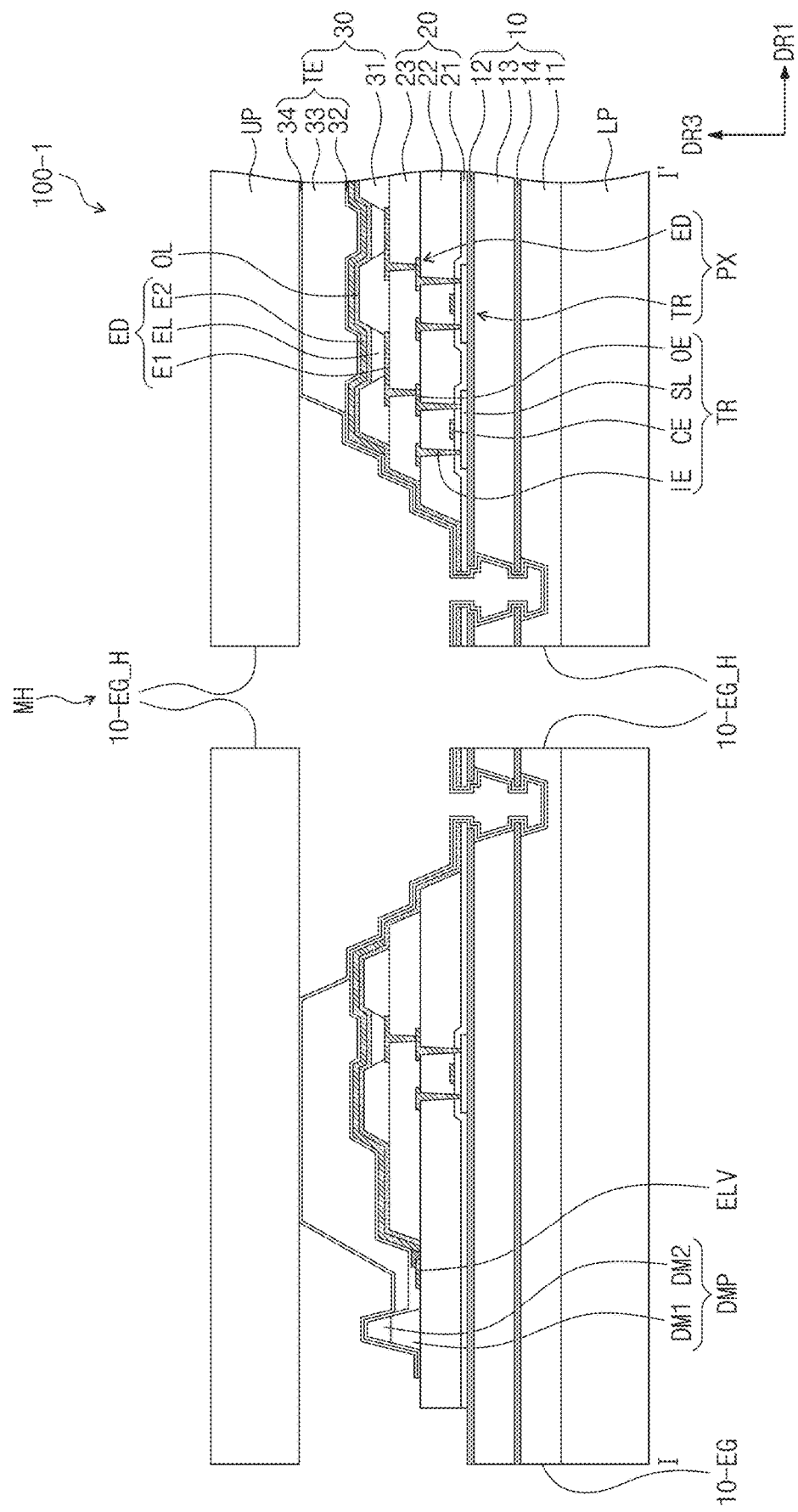
FIG. 10 is a cross-sectional view illustrating a portion of a display panel according to an embodiment of the inventive concept.

FIG. 10 is a cross-sectional view illustrating a portion of a display panel according to an embodiment of the inventive concept. In FIG. 10, areas corresponding to the areas illustrated in FIG. 4 are illustrated for ease of explanation. A display panel 100-1 illustrated in FIG. 10 may substantially correspond to the display panel 100 illustrated in FIG. 4 other than that the display panel 100-1 further includes an upper film UP and a lower film LP.

Herein, the display panel 100-1 according to an embodiment of the inventive concept will be described with reference to the FIG. 10. Same reference numerals are given to same or like configurations set forth in FIGS. 1 to 9, and duplicated descriptions thereof will be omitted.

As shown in FIG. 10, the display panel 100-1 may include the upper film UP and the lower film LP. The lower film LP is disposed on the rear surface of the base substrate 10. Although not illustrated, an adhesive layer (e.g., a predetermined adhesive layer) may be further disposed between the lower film LP and the upper film UP. The lower film LP is disposed under the base substrate 10 to protect the base substrate 10.

The upper film UP is disposed on the front surface of the base substrate 10. The upper film UP may be disposed on the sealing member TE. In an embodiment, the upper film UP is illustrated as being in contact with the sealing member TE, but separate functional layers may be further added between the sealing member TE and the upper film UP. The upper film UP protects the thin film device layer 20 and the display device layer 30.

In an embodiment, the module hole MH may pass through the upper film UP and the lower film LP. In each of the upper film UP and the lower film LP, passing-through portions corresponding to the module hole MH may be defined. Accordingly, an edge 10-EG_H of the display panel forming the module hole MH may be defined by the lower film LP, the base substrate 10, the thin film device layer 20, the display device layer 30, and the upper film UP.

The display panel 100-1 according to an embodiment of the inventive concept further includes the upper film UP and the lower film LP, such that the base substrate 10, the thin film device layer 20, and the display device layer 30 may be stably protected. Accordingly, the display panel 100-1 according to an embodiment of the inventive concept may have improved durability against an external impact.

Figure 11A:
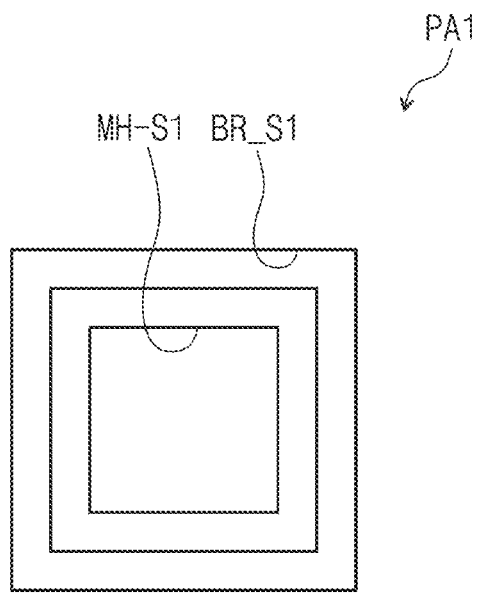
FIGS. 11A to 11C are plan views schematically illustrating a portion of configuration of a display panel according to an embodiment of the inventive concept.
Figure 11B:
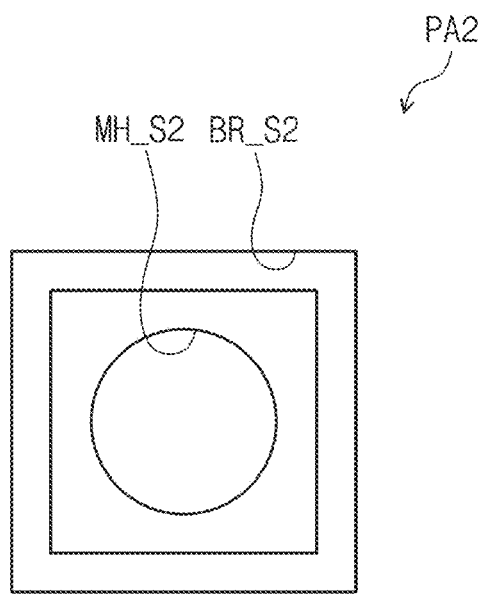
Figure 11C:
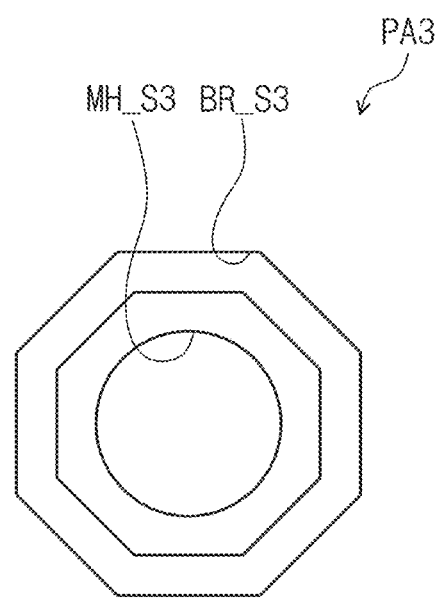

FIGS. 11A to 11C are plan views schematically illustrating a portion of configuration of a display panel according to an embodiment of the inventive concept. In FIGS. 11A to 11C, planar shapes of module parts PA1, PA2, and PA3 are illustrated. The module parts PA1, PA2, and PA3 will be described with reference to FIGS. 11A to 11C, respectively.

As shown in FIG. 11A, the module part PA1 may include a module hole MH-S1 and a blocking groove BR_S1. The module hole MH-S1 may have a polygonal shape when viewed in a plane. In an embodiment, the module hole MH-S1 is illustrated as a quadrangle. In an embodiment, the module hole MH-S1 is implemented as a polygonal columnar shape.

The blocking groove BR_S1 is formed along an edge of the module hole MH-S1. The blocking groove BR_S1 may have a shape corresponding to the module hole MH-S1. Accordingly, in an embodiment, the blocking groove BR_S1 may have a planar shape of a quadrangular ring shape that surrounds the module hole MH-S1.

Alternatively, as shown in FIG. 11B, the module part PA2 may include a module hole MH_S2 and a blocking groove BR_S2 that have different shapes from each other. In an embodiment, the module hole MH_S2 is illustrated as having a circular shape when viewed in a plane. The module hole MH_S2 may have substantially a same shape as the module hole MH illustrated in FIG. 4.

The blocking groove BR_S2 may have a different shape from the module hole MH_S2 when viewed in a plane. In an embodiment, the blocking groove BR_S2 is illustrated as having a quadrangular shape. According to the present disclosure, the blocking groove BR_S2 may have any of various shapes when disposed adjacent to the module hole MH_S2, and is not limited to a shape corresponding to the shape of the module hole MH_S2.

Alternatively, as shown in FIG. 11C, the module part PA3 may include a module hole MH_S3 and a blocking groove BR_S3 that have different shapes from each other. In an embodiment, the blocking groove BR_S3 is illustrated as having an octagonal shape when viewed in a plane. As the blocking groove BR_S3 has a more similar shape to the shape of the module hole MH_S3, the area of a space between the blocking groove BR_S3 and the module hole MH_S3 may gradually decrease. Accordingly, the area occupied by the module part PA3 provided in the display area DA (see FIG. 2) may decrease, and thus the influence to the display area DA may be reduced.

FIGS. 12A to 12J are cross-sectional views illustrating a manufacturing method of a display panel according to an embodiment of the inventive concept. FIGS. 13A to 13E are cross-sectional views illustrating a manufacturing method of a display panel according to an embodiment of the inventive concept. Herein, a method of manufacturing a display device will be described with reference to FIGS. 12A to 13E.

Figure 12A:
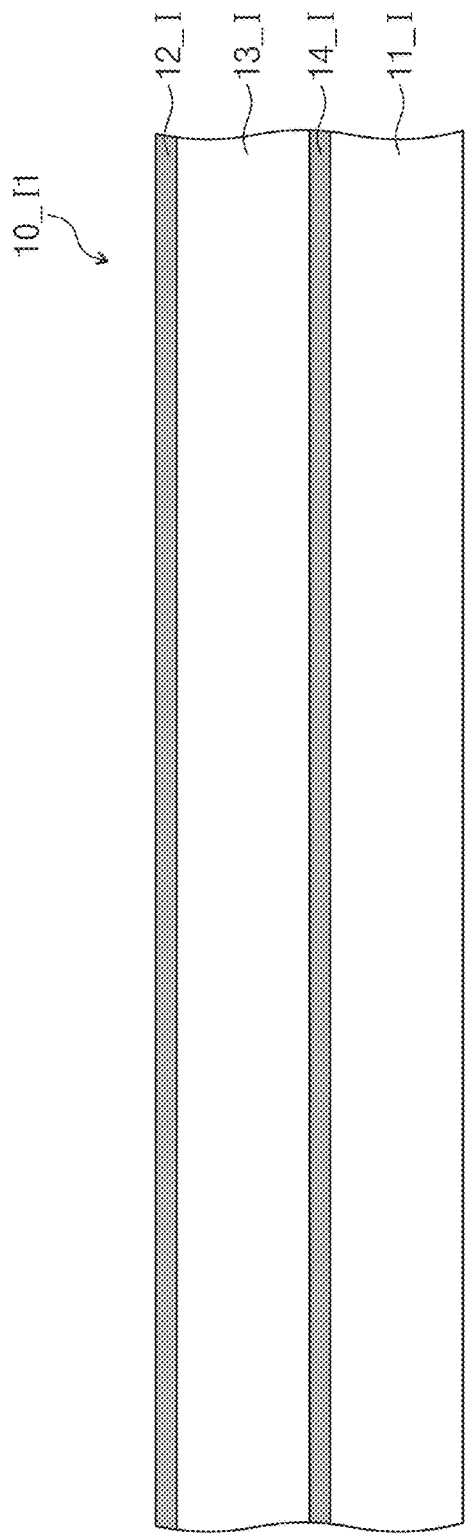

As shown in FIG. 12A, an untreated base substrate 10_I1 is provided. The untreated base substrate 10_I1 includes an untreated first base layer 11_I, an untreated first barrier layer 12_I, an untreated second base layer 13_I, and an untreated second barrier layer 14_I. The untreated first base layer 11_I and the untreated second base layer 13_I may be alternately disposed with the untreated first barrier layer 12_I and the untreated second barrier layer 14_I.

In an embodiment, the untreated first base layer 11_I, the untreated second barrier layer 14_I, the untreated second base layer 13_I, and the untreated first barrier layer 12_I are sequentially laminated toward the upper direction. The untreated first base layer 11_I may define the lowest layer, and the untreated first barrier layer 12_I may define the uppermost layer.

Figure 12B:
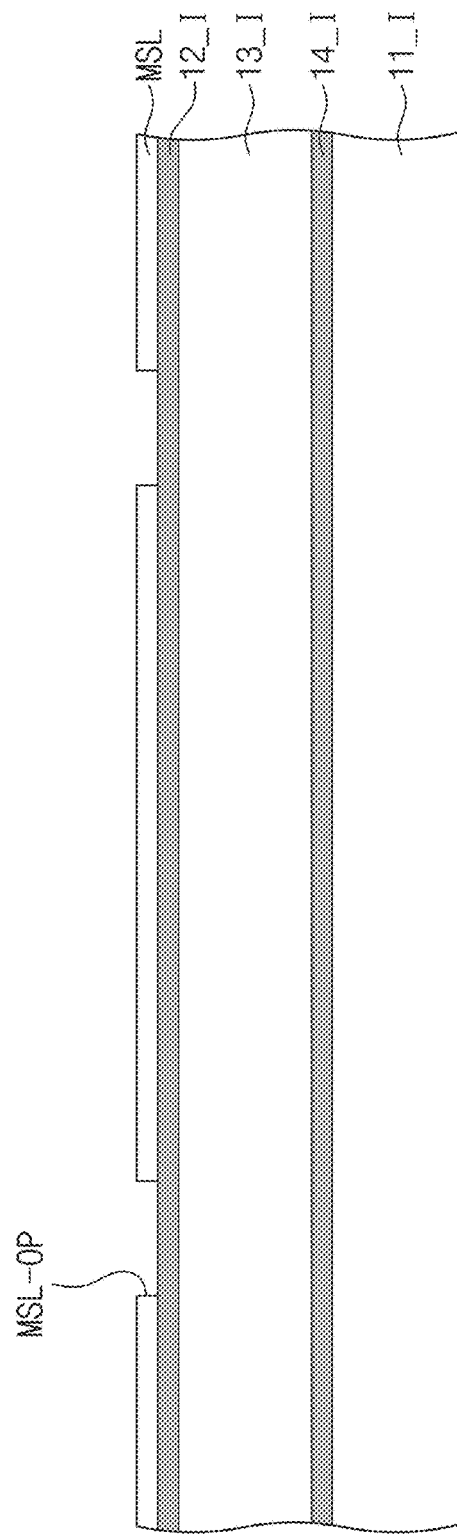

Then, as shown in FIG. 12B, a cover layer MSL may be disposed on the untreated first barrier layer 12_I. The cover layer MSL covers the untreated first barrier layer 12_I.

The cover layer MSL may be formed by using at least one of the thin film device layer 20 (see FIG. 4) and the display device layer 30 (see FIG. 4) that are described above. For example, the cover layer MSL may be formed with at least one of the first to fourth insulation layers 21, 22, 23, 41 (see FIG. 4) and the electrodes CE, IE, OE, E1.

A passing-through portion MSL-OP exposing at least a portion of the untreated first barrier layer 12_I may be formed in the cover layer MSL. The passing-through portion MSL-OP of the cover layer may be concurrently (e.g., simultaneously) formed in a formation process of the first to fourth insulation layers 21, 22, 23, 31 (see FIG. 4) and the electrodes CE, IE, OE, E1. Accordingly, the cover layer MSL may use an existing process line without adding a separate process, thereby reducing a process time and reducing a process cost.

Figure 12C:
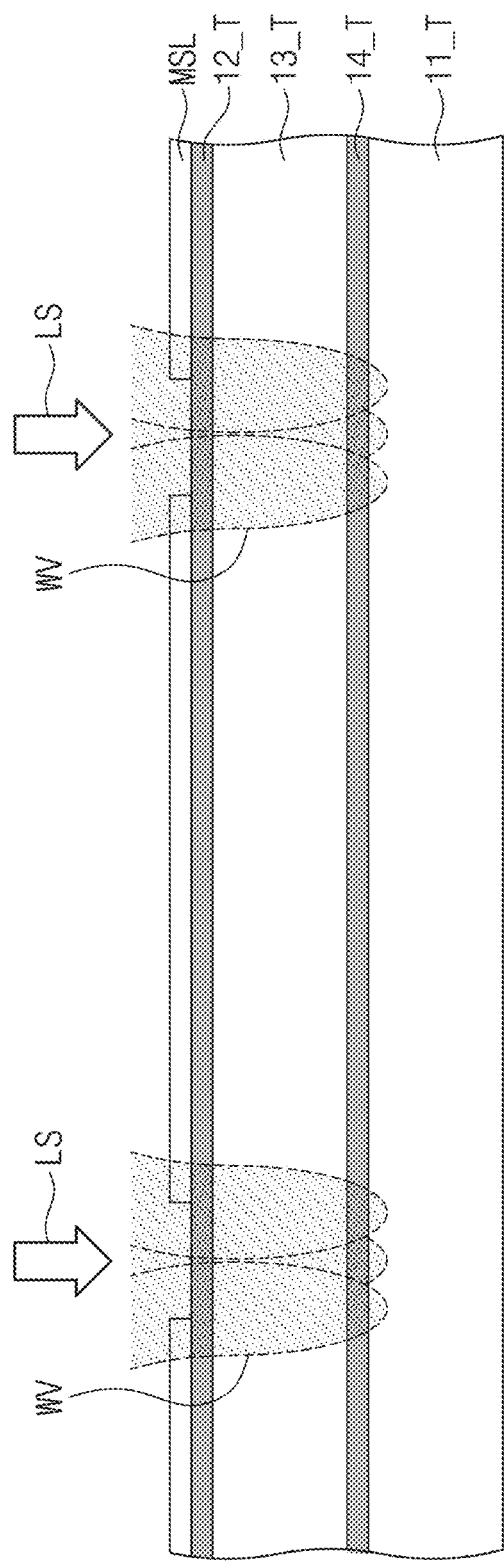

Then, as shown in FIG. 12C, light LS is provided on the cover layer MSL. The light LS may be light provided in an etching process. As shown in FIG. 12C, the light LS may be provided in a radial shape WV. Accordingly, respective layers may be etched in a shape having a greater width towards the upper side thereof.

The untreated first base layer 11_I, the untreated second barrier layer 14_I, the untreated second base layer 13_I, and the untreated first barrier layer 12_I may be converted into a heat-treated first base layer 11_T, a heat-treated second barrier layer 14_T, a heat-treated second base layer 13_T, and a heat-treated first barrier layer 12_T that are heat-treated by the light LS, respectively. Further detailed description with respect to the layers being heat-treated will be described with reference to FIGS. 13A to 13E.

Figure 13A:
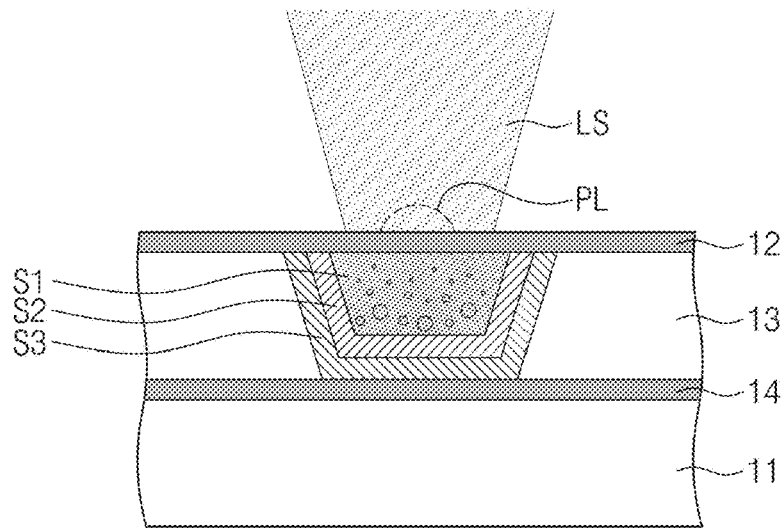
FIGS. 13A to 13E are cross-sectional views illustrating a manufacturing method of a display panel according to an embodiment of the inventive concept.

Referring to FIG. 13A, the light LS may be selected as light of wavelength having lower absorption rate for the first barrier layer 12 and higher absorption rate for the second base layer 13. In this embodiment, the light LS may be a UV laser. Most of the light LS may transmit the first barrier layer 12, and the first barrier layer 12 may not be largely affected by the light LS. The light LS may be provided in a laser form.

The light having transmitted the first barrier layer 12 arrives on the second base layer 13 disposed on the rear surface of the first barrier layer 12. The second base layer 13 is designed to have greater absorption rate for the light LS than the first barrier layer 12. In this embodiment, the light LS may be a UV laser. Accordingly, the light LS may arrive on the second base layer 13 to be absorbed in the second base layer 13. Here, a plasma PL may be generated in an area of the first barrier layer 12 on which the light is irradiated.

The second base layer 13 absorbing the light LS may be photo-reacted. The second base layer 13 may be divided into three parts based on reaction degree. A first part S1 may be a part in which the light is absorbed the most during the same period. The first part S1 may be in a state of being possibly evaporated into fine particles by a photoreaction.

A second part S2 may be a part in which less light is absorbed than in the first part S1. The second part S2 may be in a molten state by the photoreaction. A third part S3 may be a part in which less light is absorbed than in the second part S2. The third part S3 may be in a heated state by the photoreaction.

That is, as the light LS is substantially absorbed, the second base layer 13 may be heated, then changed into the molten state, and then changed into the state of being possibly evaporated. The second base layer 13 may be optically transformed in the order of the third part S3, the second part S2, and the first part S1 in each area where the light LS is irradiated.

Figure 13B:
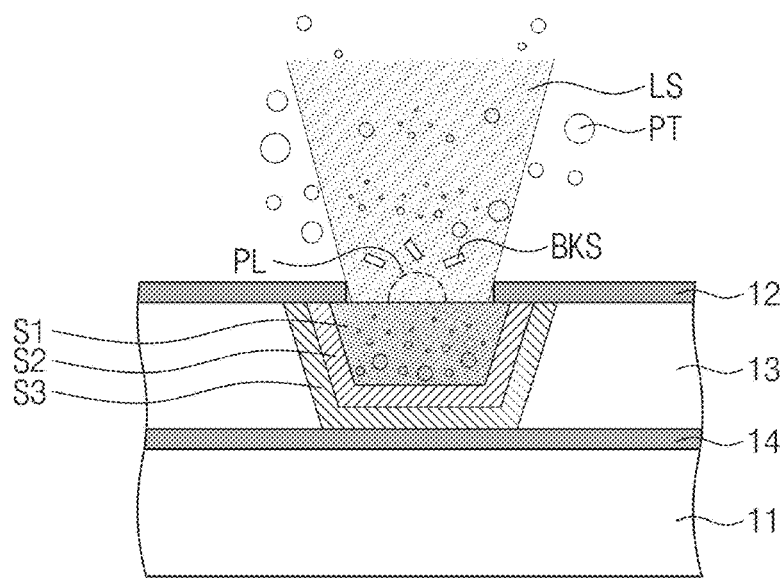

Then, as shown in FIG. 13B, as an evaporation state continues in the first part S1 or the area of the first part S1 increases, the first part S1 may break through the first barrier layer 12 to be discharged to the outside. Particles PT of the second base layer in the evaporation state are discharged to the outside while breaking through the first barrier layer 12 by evaporation pressure. As a result, fragments BKS broken from the first barrier layer 12 may be generated.

Figure 13C:
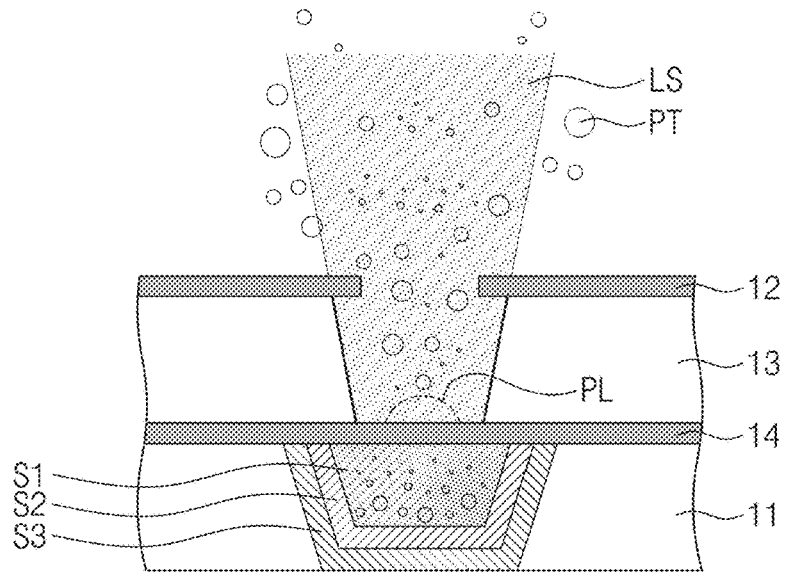

Then, as shown in FIG. 13C, when the second base layer 13 is perforated by continuous irradiation of the light LS, the second barrier layer 14 is exposed. The second barrier layer 14 may be designed to have lower absorption rate for the light LS, and the first base layer 11 may be designed to have higher absorption rate for the light LS. Most of the light LS is transmitted through the second barrier layer 14 to arrive at the first base layer 11. As described above, the first base layer 11 in which the light LS is irradiated absorbs the light LS, and is transformed into the first part S1, the second part S2, and the third part S3, and a portion of the first base layer 11 may be removed while the second barrier layer 14 is broken by the evaporation pressure.

Figure 13D:
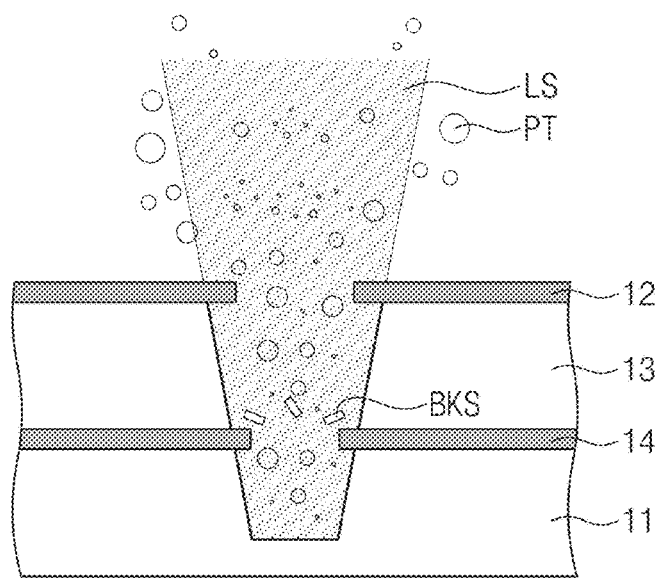
Figure 13E:
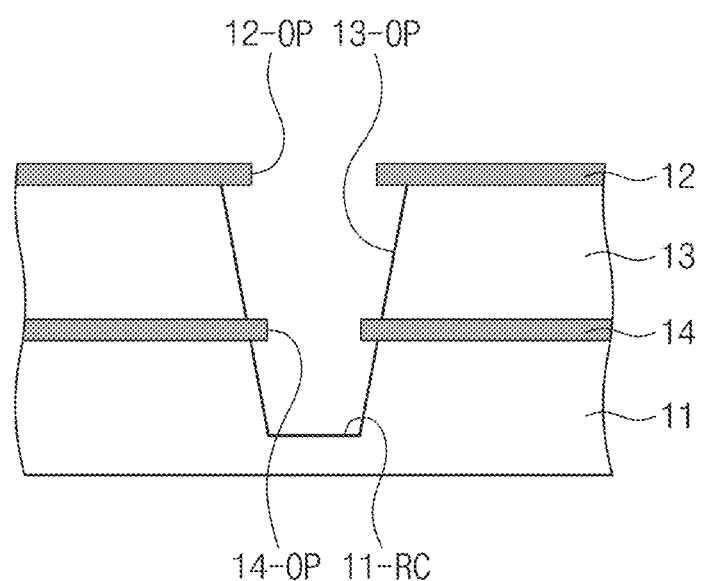

Accordingly, as shown in FIGS. 13D and 13E, the recessed portion 11-RC is formed in the first base layer 11, and the passing-through portion 12-OP of the first barrier layer, the passing-through portion 13-OP of the second base layer, and the passing-through portion 14-OP of the second barrier layer may be formed.

Referring to FIG. 12D again, the blocking groove BR_A may include the recessed portion 11-RC, the passing-through portion 12-OP of the first barrier layer, the passing-through portion 14-OP of the second barrier layer, and the passing-through portion 13-OP of the second base layer.

Due to difference in the absorption rate for the light LS among the layers, the inner surface of the blocking groove BR_A may have an undercut shape in a cross-sectional view. In an AA' region, the second base layer 13 may be undercut with respect to the first barrier layer 12. Accordingly, the first barrier layer 12 may protrude inwardly of the passing-through portion 13-OP of the second base layer. Further, in a BB' region, the first base layer 11 may be undercut with respect to the second barrier layer 14. Accordingly, the second barrier layer 14 may protrude inwardly of the recessed portion 11-RC of the first base layer.

The cover layer MSL is disposed on the first barrier layer 12, and may prevent or substantially prevent a problem that the undercut shape of the AA' region is irregularly formed due to breakage of the first barrier layer 12 in the etching process. As described above, the blocking groove BR_A according to an embodiment of the inventive concept is formed by evaporation based on absorption of the light LS and breakage of barrier layers. Since the passing-through portion 12-OP of the first barrier layer is formed by breakage of the first barrier layer 12 disposed on the uppermost layer, it may not be easy to stably control the shape of the passing-through portion 12-OP of the first barrier layer. Thus, since the passing-through portion 12-OP of the first barrier layer may be formed to have the width equal to or greater than the passing-through portion 13-OP of the second base layer, a problem that the undercut shape is not formed in the AA' region may occur.

The method of manufacturing the display panel according to an embodiment of the inventive concept further includes the cover layer MSL to cover the front surface of the first barrier layer 12. Accordingly, the problem that a crack of the first barrier layer 12 is spread or transmitted may be prevented or substantially prevented.

By forming the passing-through portion MSL-OP in a space in which the blocking groove BR_A is to be formed in the cover layer MSL, the size of the blocking groove BR_A may be stably designed and the undercut shape may be stably formed.

Figure 12E:
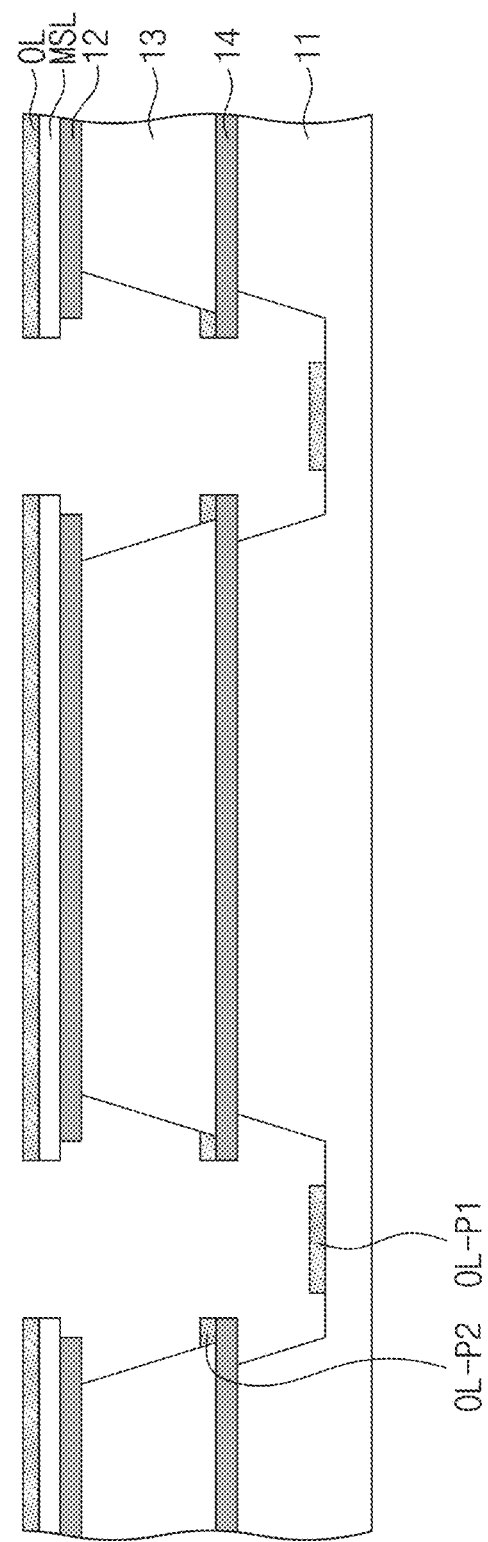

Then, as shown in FIG. 12E, the organic layer OL is formed. The organic layer OL may be formed by an evaporation process. Accordingly, the organic layer OL may be formed on the front surface of the first barrier layer 12 and within the blocking groove BR. For example, the first portion OL-P1 may be formed on the first base layer 11 within the blocking groove BR, and the second portion OL-P2 may be formed on the second barrier layer 14 within the blocking groove BR.

In the present disclosure, the organic layer OL is formed in a thickness direction. Accordingly, the organic layer OL may be difficult to be formed in a space having an undercut shape. Thus, the organic layer OL may be cut off by the blocking groove BR.

Figure 12F:
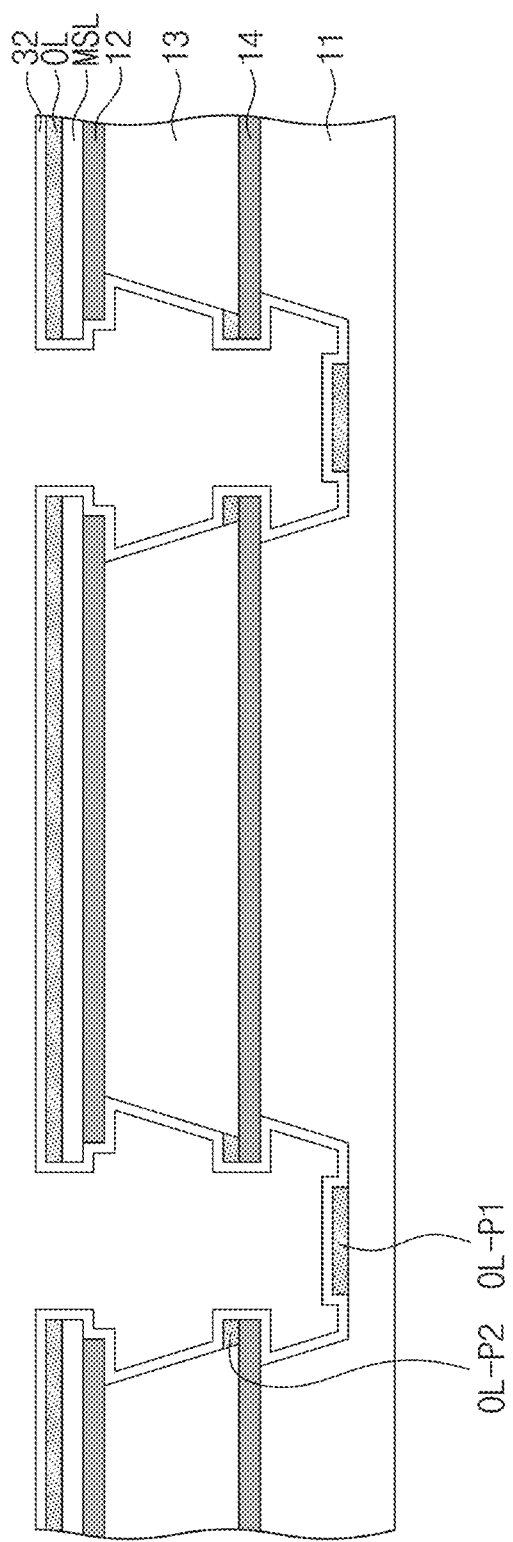

Then, as shown in FIG. 12F, the first inorganic film 32 is formed. The first inorganic film 32 may be formed on the front surface of the base substrate. In an embodiment, the first inorganic film 32 may be formed by an evaporation process. Accordingly, the first inorganic film 32 may be stably formed in an area having an undercut shape as well. The first inorganic film 32 covers an area including the blocking groove BR and a periphery area of the blocking groove BR.

In an embodiment, the portions OL-P1, OL-P2 of the organic layer that are formed in the blocking groove BR may be covered by the first inorganic film 32. The portions OL-P1, OL-P2 of the organic layer may be captured in the blocking groove BR by the first inorganic film 32. Accordingly, the problem that the portions OL-P1, OL-P2 of the organic layer are moved from the blocking groove BR or floated in a subsequent process step, thereby damaging other devices may be prevented or substantially prevented.

Figure 12G:
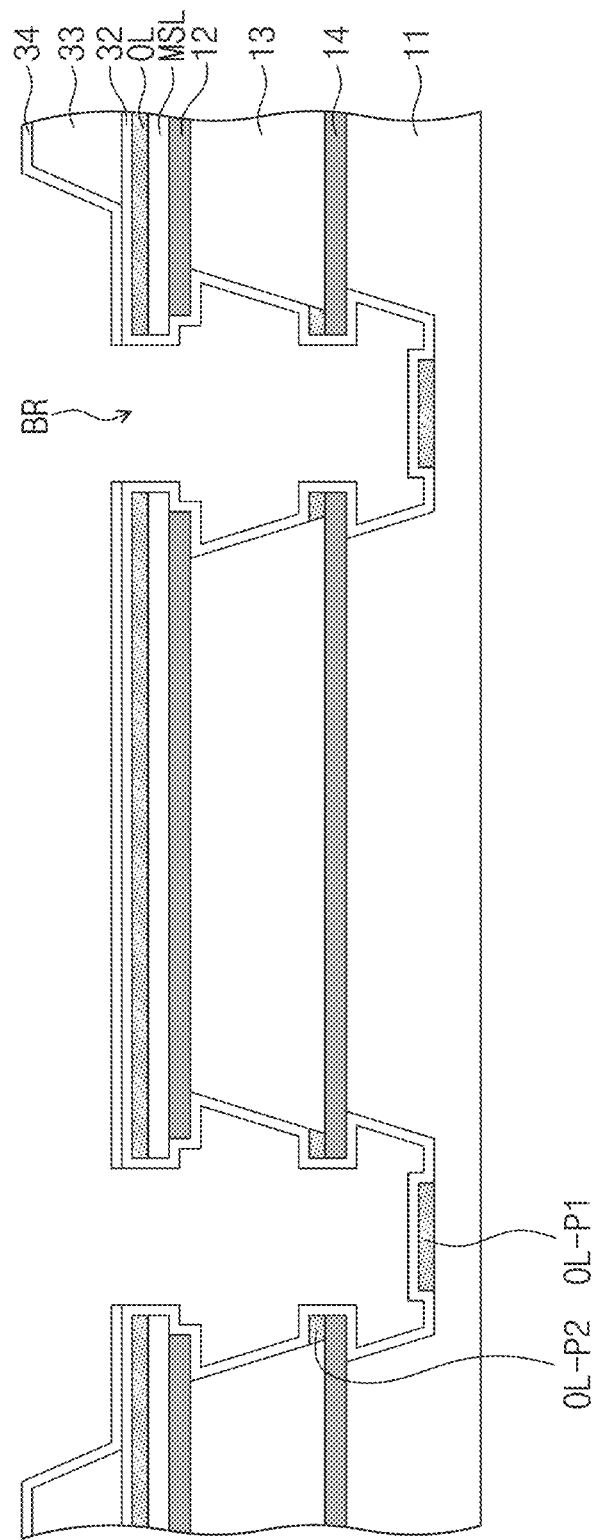

Then, as shown in FIG. 12G, the organic film 33 and the second inorganic film 34 are formed. In an embodiment, the organic film 33 may be formed through an inkjet process. A liquid organic material is provided in an area of the display area DA (see FIG. 4) that is spaced from the blocking groove BR, and may be coated on at least a portion of the first inorganic film 32 based on viscosity of the organic material, etc. As shown in FIG. 12G, the organic film 33 may be formed not to overlap the blocking groove BR.

Then, the second inorganic film 34 is formed. In an embodiment, the second inorganic film 34 may be formed through a deposition process. Accordingly, the second inorganic film 34 may be formed on the front surface of the organic film 33 and the first inorganic film 32.

Figure 12H:
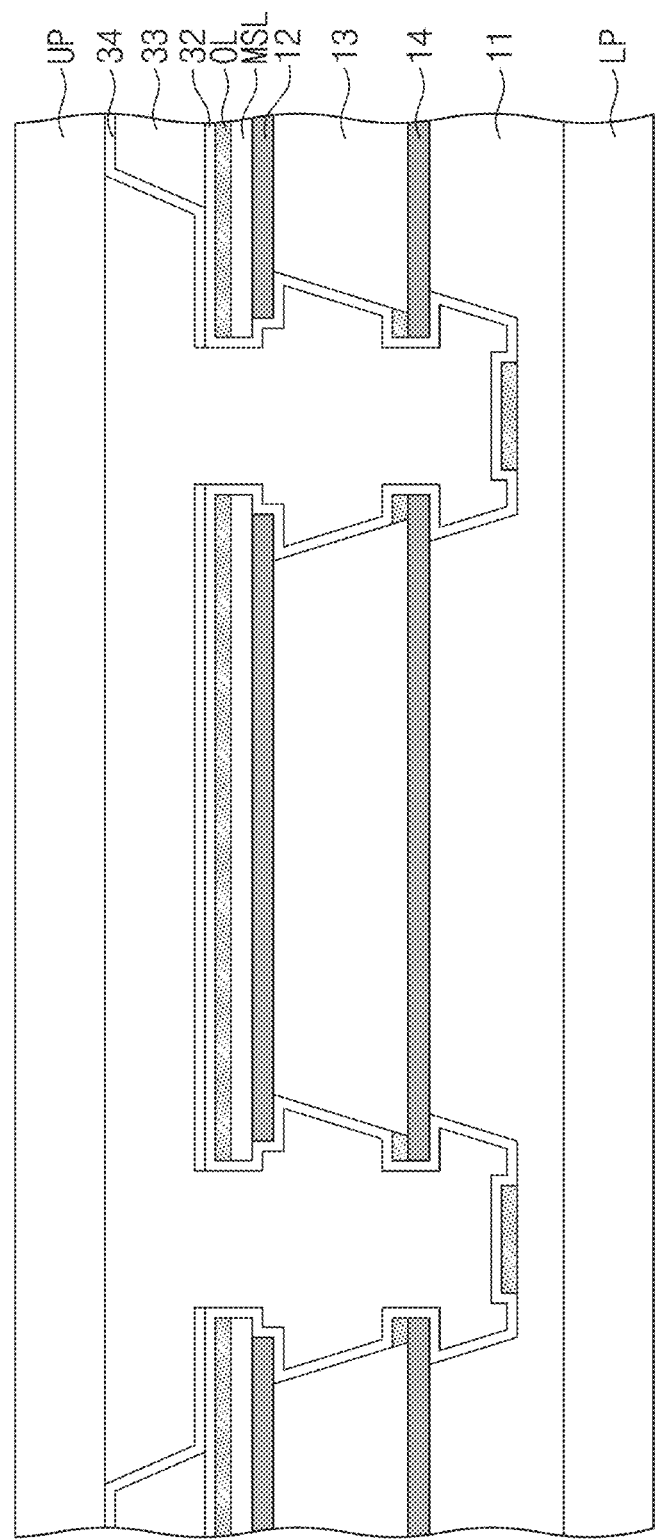

Then, as shown in FIG. 12H, the upper film UP and the lower film LP may be attached. The lower film LP may be attached to the rear surface of the first base layer 11. In an embodiment, an adhesive member (not shown) may be provided between the lower film LP and the first base layer 11. The upper film UP may be disposed on the second inorganic film 34. In an embodiment, an adhesive member (not shown) may be provided between the upper film UP and the first base layer 11.

Then, as shown in FIGS. 12I and 12J, the module hole MH is formed by removing a portion of the display panel. The module hole MH may be formed in an area surrounded by the blocking groove BR. As shown in FIG. 12I, light LS is irradiated in an area delimited by dashed dotted lines. The light LS may include a laser of a short wavelength. Accordingly, the module hole MH may include a passing-through portion LP-OP passing through the lower film LP and a passing-through portion UP-OP passing through the upper film UP.

The module hole MH is formed through a cutting process using the light LS. Accordingly, the light may have a wavelength band different from the light LS in forming the blocking groove BR. However, the module hole MH may be formed by using a knife, a drill, etc., and is not limited to any one embodiment.

As the module hole MH is formed, cross sections of the first base layer 11, the first barrier layer 12, the second base layer 13, the second barrier layer 14, the cover layer MSL, the organic film OL, the first inorganic film 32, and the second inorganic film 34 may be exposed to the outside. Here, the cross sections exposed to the outside may become an inflow path by which external moisture or oxygen may be introduced through the layers. Particularly, the organic layer OL containing an organic material is relatively easier for moisture/oxygen to penetrate.

The display panel according to an embodiment of the inventive concept includes the blocking groove BR formed adjacent to the module hole MH. The blocking groove BR cuts off or separates continuity of layers having a cross section exposed by the module hole MH, such as the organic layer OL, the first barrier layer 12, the second barrier layer 14, and the second base layer 13. Particularly, in the case of the organic layer OL, the portion exposed by the module hole MH is cut off or separated from the portion disposed under the thin film sealing layer. Accordingly, a problem of devices in the display area being damaged by external moisture or oxygen introduced through the module hole MH may be prevented or substantially prevented. Thus, reliability of the display panel according to an embodiment of the inventive concept may be improved.

According to the present disclosure, it is possible to easily prevent or substantially prevent damage to devices by moisture or oxygen introduced from the outside. Thus, an electronic device with improved reliability in process and in use may be provided. Further, according to the present disclosure, a blocking groove with reduced defects may be easily designed without adding a separate process. Thus, a process is simplified, and process cost may be reduced.

Although some exemplary embodiments of the present invention have been described, it is to be understood that the present invention should not be limited to these exemplary embodiments but, rather, various changes and modifications can be made by one ordinary skilled in the art within the spirit and scope of the present invention. Hence, the technical scope of the present invention shall not be limited to the description of the specification, but shall be determined by the technical scope of the accompanying claims.

What is claimed is:

1. A display panel comprising:
   a base substrate comprising a front surface and a rear surface, and including a display area and a periphery area adjacent to the display area in a plan view;
   a pixel layer comprising a plurality of pixels in the display area, and the pixel layer comprising a thin film transistor comprising a semiconductor pattern disposed on the base substrate; and
   a cover layer on the base substrate and containing an inorganic material, wherein
   the base substrate comprises:
   a module hole defined in the display area and passing through the front surface and the rear surface of the base substrate; and
   a blocking groove defined in the display area and adjacent to the module hole, and recessed from the front surface of the base substrate, and wherein the cover layer covers the front surface of the base substrate and comprises a passing-through portion overlapping the blocking groove.

2. The display panel according to claim 1, wherein the base substrate comprises:
   a first base layer containing an organic material and comprising the rear surface of the base substrate; and
   a first barrier layer containing an inorganic material and arranged on the first base layer to define the front surface of the base substrate, and wherein
   the blocking groove comprises:
   a passing-through portion passing through the first barrier layer; and
   a recessed portion defined in the first base layer by overlapping the passing-through portion passing through the first barrier layer, and wherein
   a width of the passing-through portion of the cover layer is equal to or less than a width of the passing-through portion passing through the first barrier layer.

3. The display panel according to claim 2, wherein a width of the recessed portion is greater than the width of the passing-through portion passing through the first barrier layer.

4. The display panel according to claim 2, wherein the base substrate further comprises:
   a second base layer between the first base layer and the first barrier layer and containing an organic material; and
   a second barrier layer between the first base layer and the first barrier layer and containing an inorganic material, and wherein
   the first barrier layer and the second barrier layer are alternately arranged with the first base layer and the second base layer.

5. The display panel according to claim 4, wherein the blocking groove further comprises:
   a passing-through portion passing through the second barrier layer; and
   a passing-through portion passing through the second base layer, and wherein
   a width of the passing-through portion passing through the second barrier layer is less than a width of the passing-through portion passing through the second base layer.

6. The display panel according to claim 1, wherein the pixel layer comprises:
   a thin film device layer on the base substrate and comprising the thin film transistor; and
   a display device layer on the base substrate and comprising an organic light emitting device connected to the thin film transistor, and wherein
   the cover layer comprises a portion of the display device layer and the thin film device layer.

7. The display panel according to claim 6, wherein the cover layer comprises an inorganic film or a metal film.

8. The display panel according to claim 6, wherein the organic light emitting device comprises:
a first electrode;
an organic layer on the first electrode; and
a second electrode on the organic layer, and wherein the thin film device layer comprises a plurality of conductive layers and a plurality of insulation layers, and the cover layer extends from at least one of the conductive layers, the insulation layers, and the first electrode.

9. The display panel according to claim 8, wherein the display device layer further comprises a sealing member on the organic light emitting device, wherein the sealing member covers the blocking groove and the passing-through portion of the cover layer.

10. The display device according to claim 9, wherein the sealing member comprises: a first inorganic film; a second inorganic film on the first inorganic film; and an organic film between the first inorganic film and the second inorganic film, wherein
the first inorganic film and the second inorganic film on the organic light emitting device are spaced from each other with the organic film therebetween, and are in contact with each other within the blocking groove.

11. An electronic device comprising:
a display panel comprising a plurality of pixels, and a base substrate comprising a front surface including a display area in which the pixels are arranged and a periphery area adjacent to the display area, and a rear surface opposite to the front surface, each of the plurality of pixels comprising a thin film transistor comprising a semiconductor pattern disposed on the front surface; and
an electronic module electrically connected to the display panel,
wherein the base substrate comprises:
a module hole defined in the display area and passing through the front surface and the rear surface of the base substrate; and
a blocking groove defined in the display area and adjacent to the module hole, and recessed from the front surface of the base substrate,
and wherein the electronic module overlaps the module hole in a plan view.

12. The electronic device according to claim 11, wherein the electronic module comprises at least one of a voice output module, an image capturing module, and a light receiving module.

13. The electronic device according to claim 11, wherein the blocking groove has a shape of a closed curve surrounding the module hole when viewed in a plane.

14. The electronic device according to claim 11, wherein the base substrate comprises:
a first base layer containing an organic material and comprising the rear surface of the base substrate;
a first barrier layer containing an inorganic material and arranged on the first base layer to comprise the front surface of the base substrate;
a second base layer containing an organic material and arranged between the first base layer and the first barrier layer, and
a second barrier layer containing an inorganic material and arranged between the first base layer and the second base layer,
and wherein the blocking groove passes through the first barrier layer, the second barrier layer, and the second base layer, and is defined by a portion of the first base layer being recessed.

15. The electronic device according to claim 14, wherein the first barrier layer protrudes from the second base layer within the blocking groove, and the second barrier layer protrudes from the first barrier layer within the blocking groove.

16. The electronic device according to claim 11, wherein each of the plurality of the pixels comprises:
the thin film transistor comprising a control electrode, an input electrode, an output electrode, and the semiconductor pattern; and
an organic light emitting device comprising a first electrode connected to the thin film transistor, a second electrode on the first electrode, a light emitting layer, and an organic layer between the first electrode and the second electrode and comprising a charge control layer, wherein
the organic layer comprises a portion comprising a first edge that is cut off along the module hole, and a second edge overlapping the thin film transistor and cut off along the blocking groove, wherein
the portion comprising the first edge and the portion comprising the second edge are spaced apart from each other with the blocking groove therebetween.

17. The electronic device according to claim 16,
further comprising a sealing member on the organic light emitting device, wherein
the sealing member exposes the first edge and covers the second edge.

18. The electronic device according to claim 17, wherein the sealing member covers an inner surface of the blocking groove.

19. The electronic device according to claim 18, wherein the organic layer is arranged within the blocking groove and further comprises organic portions that are separated from the portion comprising the first edge and the portion comprising the second edge, respectively, wherein each of the organic portions is covered by the sealing member.

20. The electronic device according to claim 16, wherein the display panel further comprises a cover layer extending from a layer arranged between the organic layer and the base substrate, containing an inorganic material, and comprising a passing-through portion overlapping the blocking groove.

21. The electronic device according to claim 20, wherein a width of the passing-through portion of the cover layer is equal to or less than a width of the blocking groove.

22. The electronic device according to claim 20, wherein the second edge of the organic layer is aligned with the passing-through portion of the cover layer.

23. A display panel comprising:
a flexible substrate including a display area and a periphery area adjacent to the display area on a plane, and comprising a first base layer and a first barrier layer on the first base layer; and
an organic layer and a thin film transistor comprising a semiconductor pattern in the display area and on the flexible substrate, wherein
the flexible substrate comprises:
a module hole defined in the display area and passing through the first barrier layer and the first base layer; and
a blocking groove defined in the display area and adjacent to the module hole, passing through the first barrier layer, and recessed from a front surface of the first base layer.

24. The display panel according to claim 23, wherein
the organic layer comprises a first portion comprising a first edge that is cut off along the module hole, and a second portion comprising a second edge cut off along the blocking groove, wherein
the first portion and the second portion are spaced from each other with the blocking groove therebetween.

25. The display panel according to claim 24,
further comprising a sealing member on the organic layer and comprising an inorganic layer, wherein
the first edge is exposed from the sealing member, and the second edge is covered by the sealing member.

26. The display panel according to claim 23, wherein a UV light absorption rate of the first barrier layer is lower than a UV light absorption rate of the first base layer.

27. The display panel according to claim 23, wherein the first barrier layer protrudes from the first base layer within the blocking groove.

\* \* \* \* \*